United States Patent [19]
Behm et al.

[11] Patent Number: 5,599,046
[45] Date of Patent: *Feb. 4, 1997

[54] LOTTERY TICKET STRUCTURE WITH CIRCUIT ELEMENTS

[75] Inventors: William F. Behm, Marietta; Kenneth E. Irwin, Jr., Alpharetta; Mark C. Tevis, Cumming, all of Ga.

[73] Assignee: Scientific Games Inc., Alpharetta, Ga.

[ * ] Notice: The term of this patent shall not extend beyond the expiration date of Pat. No. 5,475,205.

[21] Appl. No.: 263,888

[22] Filed: Jun. 22, 1994

[51] Int. Cl.⁶ .................................................. B42D 15/00
[52] U.S. Cl. ............................ 283/83; 283/100; 283/901; 283/903
[58] Field of Search ................................. 283/57, 58, 59, 283/60.1, 72, 83, 84, 100, 102, 901, 903; 235/487, 490, 492

[56] References Cited

U.S. PATENT DOCUMENTS

| | | |
|---|---|---|
| 2,384,667 | 9/1945 | Dowd . |
| 2,961,777 | 11/1960 | Neville et al. . |
| 2,986,820 | 6/1961 | Neville et al. . |
| 3,055,117 | 9/1962 | Bernstein et al. . |
| 3,556,530 | 1/1971 | Barr et al. . |
| 3,594,004 | 7/1971 | Barr et al. . |
| 3,617,374 | 11/1971 | Hodson et al. . |
| 3,687,072 | 8/1972 | Pym . |
| 3,699,311 | 10/1972 | Dunbar . |
| 3,790,754 | 2/1974 | Black et al. . |
| 3,868,057 | 2/1975 | Chavez ........................................ 283/83 |
| 3,876,865 | 4/1975 | Bliss ........................................... 283/83 |
| 3,877,155 | 4/1975 | Royka et al. . |
| 3,907,694 | 9/1975 | Lu . |
| 3,930,673 | 1/1976 | Sanden . |
| 3,938,993 | 2/1976 | Royka et al. . |
| 3,985,663 | 10/1976 | Lu et al. . |
| 3,993,842 | 11/1976 | Hirsch et al. . |
| 4,033,611 | 7/1977 | Johnsen . |
| 4,059,444 | 11/1977 | Lu et al. . |
| 4,074,911 | 2/1978 | Stipeck, Jr. . |
| 4,087,092 | 5/1978 | Krause et al. . |
| 4,095,824 | 6/1978 | Bachman . |
| 4,099,721 | 7/1978 | Logander . |
| 4,120,445 | 10/1978 | Carrier et al. . |
| 4,157,829 | 6/1979 | Goldman et al. . |
| 4,174,857 | 11/1979 | Koza . |
| 4,230,344 | 10/1980 | Bell, Jr. et al. . |
| 4,231,593 | 11/1980 | Bell, Jr. et al. . |
| 4,241,942 | 12/1980 | Bachman . |

(List continued on next page.)

FOREIGN PATENT DOCUMENTS

| | | |
|---|---|---|
| 2001944 | 7/1971 | Germany . |
| 305694 | 12/1990 | Japan ........................................ 283/83 |
| 0027489 | 5/1991 | Japan . |
| 404085093A | 3/1992 | Japan . |
| 2075918 | 11/1981 | United Kingdom . |
| 8700285 | 12/1987 | WIPO . |

*Primary Examiner*—David P. Bryant
*Attorney, Agent, or Firm*—Michael B. McMurry; Kathleen A. Ryan

[57] ABSTRACT

Information can be retrieved from lottery tickets and lottery ticket security can be improved by printing electronic circuits or circuit elements on the ticket. Conductive or semi-conductive ink can be printed on the ticket by using gravure, relief, planographic, letter press or flexographic methods to form the circuit elements. In one embodiment the circuit elements are printed over play indicia and under a scratch-off coating so that they are removed when the ticket is played. An electronic verification machine can then be used to determine which portions of the scratch-off coatings coveting the play indicia have been removed. A second group of circuit elements can also be printed under the play indicia which improves security by blocking light that may be shined through the ticket and by being tested, along with the first group of circuit elements, for integrity by the electronic verification machine. Printing circuit elements on lottery tickets is particularly suitable for probability tickets because it makes it possible to automatically detect which latex play spots coveting the play indicia have been removed or tampered with.

28 Claims, 13 Drawing Sheets

U.S. PATENT DOCUMENTS

| | | |
|---|---|---|
| 4,273,362 | 6/1981 | Carrier et al. . |
| 4,299,637 | 11/1981 | Oberdeck et al. . |
| 4,371,196 | 2/1983 | von Kempski et al. . |
| 4,398,708 | 8/1983 | Goldman et al. . |
| 4,407,443 | 10/1983 | McCorkle . |
| 4,457,430 | 7/1984 | Darling et al. . |
| 4,466,614 | 8/1984 | Bachman et al. . |
| 4,488,646 | 12/1984 | McCorkle . |
| 4,507,550 | 3/1985 | Fleer . |
| 4,511,616 | 4/1985 | Pitts et al. . |
| 4,528,222 | 7/1985 | Rzepecki et al. . |
| 4,536,218 | 8/1985 | Ganho . |
| 4,579,371 | 4/1986 | Long et al. . |
| 4,585,254 | 4/1986 | Adams . |
| 4,586,711 | 5/1986 | Winters et al. . |
| 4,591,189 | 5/1986 | Holmen et al. ............................ 283/83 |
| 4,591,190 | 5/1986 | Clark . |
| 4,591,707 | 5/1986 | Stenzel et al. . |
| 4,609,207 | 9/1986 | Muck et al. . |
| 4,697,514 | 10/1987 | George et al. . |
| 4,725,079 | 2/1988 | Koza . |
| 4,726,608 | 2/1988 | Walton . |
| 4,759,970 | 7/1988 | Seeger, Jr. et al. . |
| 4,763,927 | 8/1988 | Schneider ................................. 283/83 |
| 4,804,601 | 2/1989 | Watson et al. . |
| 4,820,912 | 4/1989 | Samyn . |
| 4,849,287 | 7/1989 | Itoh et al. . |
| 4,863,757 | 9/1989 | Durand . |
| 4,880,964 | 11/1989 | Donahue . |
| 4,946,733 | 8/1990 | Seeger, Jr. et al. . |
| 5,013,606 | 5/1991 | Miyoshi et al. . |
| 5,047,283 | 9/1991 | Leatherman et al. . |
| 5,061,551 | 10/1991 | Durand . |
| 5,074,566 | 12/1991 | Desbiens . |
| 5,092,598 | 3/1992 | Kamille ................................... 283/903 |
| 5,093,038 | 3/1992 | Durand . |
| 5,112,672 | 5/1992 | Kaule et al. . |
| 5,126,390 | 6/1992 | Duff . |
| 5,137,542 | 8/1992 | Buchanan et al. . |
| 5,151,386 | 9/1992 | Bottari et al. . |
| 5,151,582 | 9/1992 | Fujioka . |
| 5,193,815 | 3/1993 | Pollard .................................... 283/901 |
| 5,204,681 | 4/1993 | Greene . |
| 5,215,576 | 6/1993 | Carrick . |
| 5,228,692 | 7/1993 | Carrick et al. . |
| 5,411,260 | 5/1995 | Smith ...................................... 283/903 |
| 5,444,223 | 8/1995 | Blama ..................................... 235/487 |
| 5,471,039 | 11/1995 | Irwin, Jr. et al. ....................... 235/492 |
| 5,471,040 | 11/1995 | May . |
| 5,475,205 | 12/1995 | Behm et al. ............................ 235/492 |
| 5,484,292 | 1/1996 | McTaggart ............................. 434/317 |
| B1 4,183,989 | 5/1990 | Tooth . |

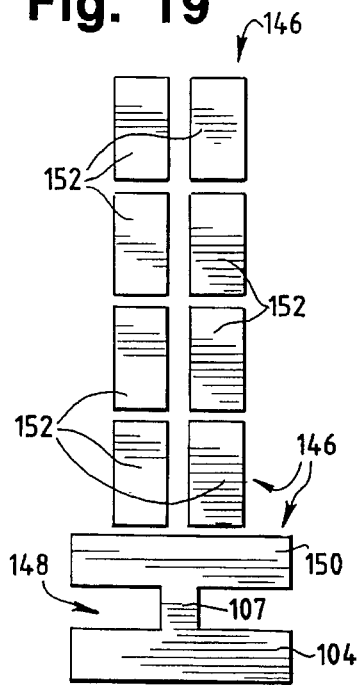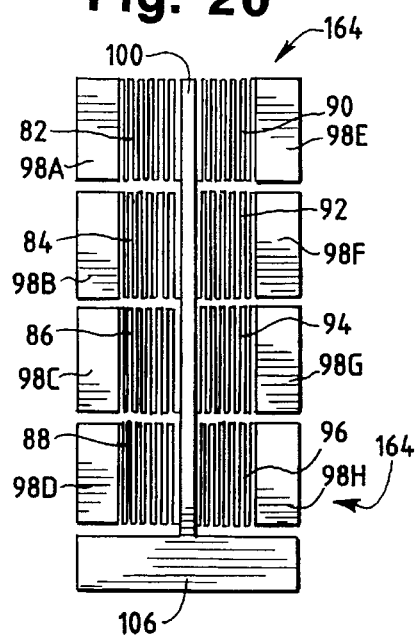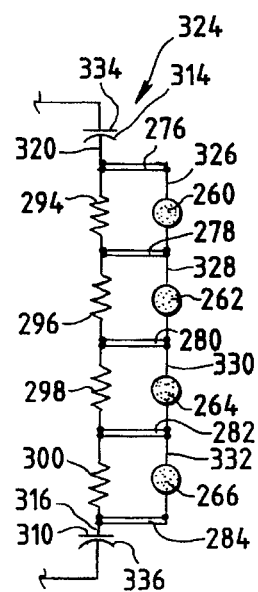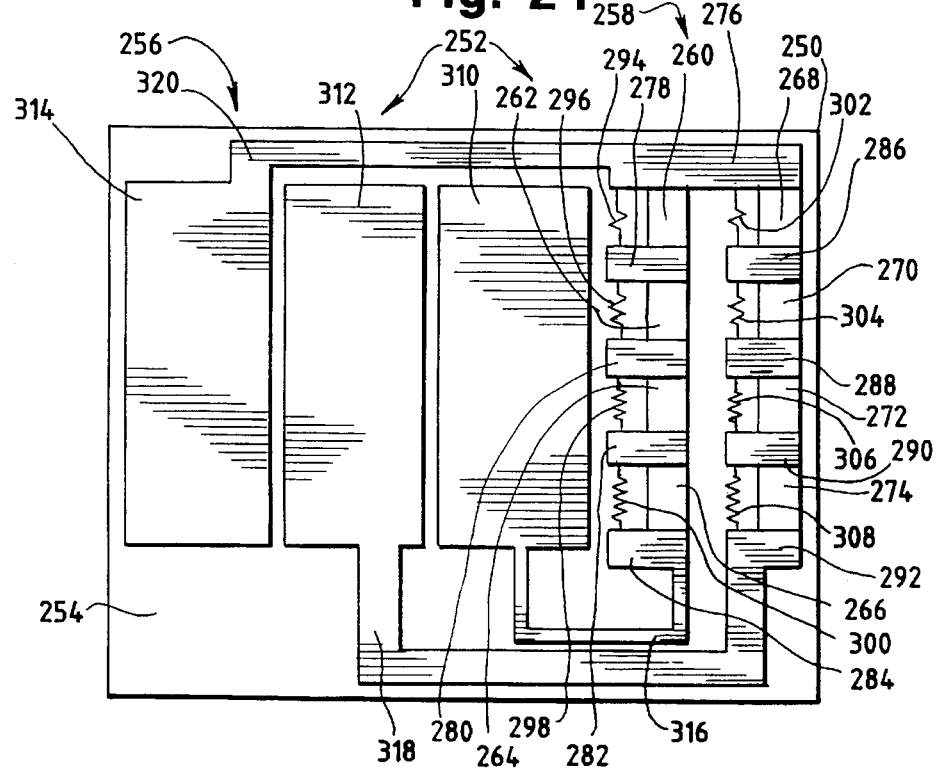

LOTTERY TICKET STRUCTURE WITH CIRCUIT ELEMENTS

FIELD OF THE INVENTION

The invention relates to the field of game cards and more particularly to lottery ticket structure and methods of printing lottery tickets.

BACKGROUND OF THE INVENTION

It is often desirable to obtain information from documents in addition to the human readable information printed on the surface of the document. For instance, documents of many types are susceptible to tampering, alteration and counterfeiting. Lottery tickets for probability games are an example of a document which is particularly susceptible to tampering. A probability game lottery ticket normally has play areas, each containing play indicia covered by an opaque material, for example a latex material. To play the game, an individual scratches off the latex covering a specified number of the play areas to reveal the play indicia underneath. The player then determines if the combination of revealed play indicia is a winner such as the play indicia are all the same symbol or add up to a winning number.

Part of the popularity of such probability games is derived from the fact that each and every ticket is a potential winner. If a player has lost, the player can scratch off the latex covering the remaining play areas and verify that at least one winning combination is present. Consequently, this type of game is generally perceived by lottery players as being more legitimate than other types of instant lottery games.

The fact that every ticket is potentially a winner also invites players to tamper with the tickets. Because every ticket can win if the right play areas are selected, some players look for ways to determine the play indicia contained in every play area in order to identify the location of a winning combination. If the player can conceal the fact that he has seen the play indicia, the player subsequently can remove the latex covering from the play areas containing the winning combination and claim a prize.

One technique used to accomplish this result involves lifting the latex to look at the play indicia before gluing the latex back into place. Typically, probability game lottery tickets are validated by the visual observation of a human lottery agent. It can be difficult to visually detect this sort of tampering. Thus, probability game lottery tickets are particularly susceptible to fraudulent tampering and because no effective way of preventing or detecting such tampering has been developed, probability lottery games have not become commercially successful.

A second threat to the integrity of a document is the intentional alteration of its contents. For example, an individual may try to alter the information on a driver's license, contract, test answer form, invoice or inventory form. Such an alteration may involve the changing of a number in the document by removing the original number and inserting a new number. In many cases alterations can be very difficult to detect, especially if there are no other copies of the document.

A third type of problem posed in the document security context involves counterfeiting. Rather than altering an existing document, the counterfeiter actually creates a document and attempts to pass it off as being genuine. Thus, paper currency, tickets, tags, and labels are often counterfeited and proffered as the real thing. The magnitude of this problem has substantially increased with the advent of the color photo copier.

For example, the owner of a trademark might sell t-shirts bearing that trademark to increase the value of the shirt. In an attempt to thwart pirates, the trademark owner might also attach a identifying tag to the t-shirts. This makes it easier to determine whether a given t-shirt is genuine. In order to disguise the fact that t-shirts are counterfeits, a counterfeiter will reproduce not only the t-shirt's design, but also the tag. While being forced to create a similar looking tag will increase his costs, if the value of the trademark is sufficiently high, the counterfeiter will continue to attach a counterfeited tag.

There have been a number of techniques developed to improve the security of printed documents including the addition of magnetic materials to the document which are magnetically encoded with information that can be used to verify its authenticity. However, magnetically encoded information can in many instances be easily detected, read and altered and thus is not always suitable for verifying the integrity of a document and as such is generally not suitable for lottery tickets and probability tickets in particular. Other methods for verifying the integrity of lottery tickets have been used such as inks that change color when tampered with but none of these methods have been sufficiently secure to permit the commercial sale of probability tickets.

Hence, it is desirable to provide an improved system for obtaining information from documents to discourage tampering, alteration and counterfeiting.

OBJECT AND SUMMARY OF THE INVENTION

It is therefore an object of the invention to provide a lottery ticket structure and method of printing same that will provide for increased security as well as permitting information to be automatically read from the ticket.

Another object of the invention is to provide a lottery ticket structure and method of printing same that will result in a lottery ticket having sufficient security to be used as a probability ticket.

A further object of the invention is to provide a lottery ticket which includes a substrate, play indicia printed over the substrate and a scratch-off coating covering the play indicia which includes at least one electronic circuit element printed in conductive ink on the ticket. The electronic circuits can be printed over the play indicia and beneath the scratch-off coating. In this case the lottery ticket can also include a seal coat applied over the play indicia and a release coat applied over the seal coat and below the electronic circuit elements to facilitate the removal of the electronic circuits when the scratch-off coating is removed or tampered with.

An additional object of the invention is to provide a lottery ticket that includes a substrate, a first electronic circuit or circuits printed on the substrate, a primer layer printed over the first electronic circuits, play indicia printed on the primer layer, seal and release coats printed over said play indicia and a scratch-off coating printed over the release coat. A second printed electronic circuit or circuits can be located between the seal and release coats over the play indica. In some cases it may be desirable to provide an electrical connection between the first electronic circuits and the second electronic circuits. Also, in the case where a bar code is printed on the lottery ticket, the first electronic circuit can be located underneath the bar code.

These objects are accomplished in the present invention by printing one or more electrical circuits onto the lottery ticket. The circuits are printed in conductive or semiconductive ink using, for example, a gravure, a relief, a planographic, a letter press or a flexographic printing process. When the redemption value or the integrity of the lottery ticket is to be determined, an external verification machine can be used to detect the presence and status of the printed electronic circuits. Any attempted tampering or alteration of the lottery ticket will cause detectable changes in the characteristics of the circuit. Altering of a lottery ticket is also made more difficult because in most cases it will require that a circuit acceptable to the external verification machine must be created. The expense of determining how to print, and actually printing, an acceptable circuit will generally outweigh any possible gain from the tampering with or altering of a lottery ticket. Therefore, the printing of electrical circuit elements on lottery tickets can significantly reduce or eliminate altogether the problem of unauthorized alteration and tampering with lottery tickets thereby making certain types of lottery tickets such as probability tickets commercially feasible. Moreover, the printing of circuit elements on lottery tickets makes it possible to automate the redemption and validation process.

BRIEF DESCRIPTION OF THE DRAWINGS

FIG. 19 is a plan drawing of the partial printed circuit used to determine the authenticity and integrity of the bar code of the ticket in FIG. 1;

FIG. 20 is a plan drawing of the partial printed circuit used to determine the authenticity and integrity of the play spot areas of the ticket in FIG. 1;

FIG. 21 is a plan drawing of another printed partial circuit which can be used to determine the authenticity and integrity of a probability lottery ticket;

FIG. 22 is a schematic circuit diagram of the completed circuit which is formed when the partial circuit in FIG. 20 is coupled to an external verification machine;

DETAILED DESCRIPTION OF THE INVENTION

I. General Overview

Figure 1:
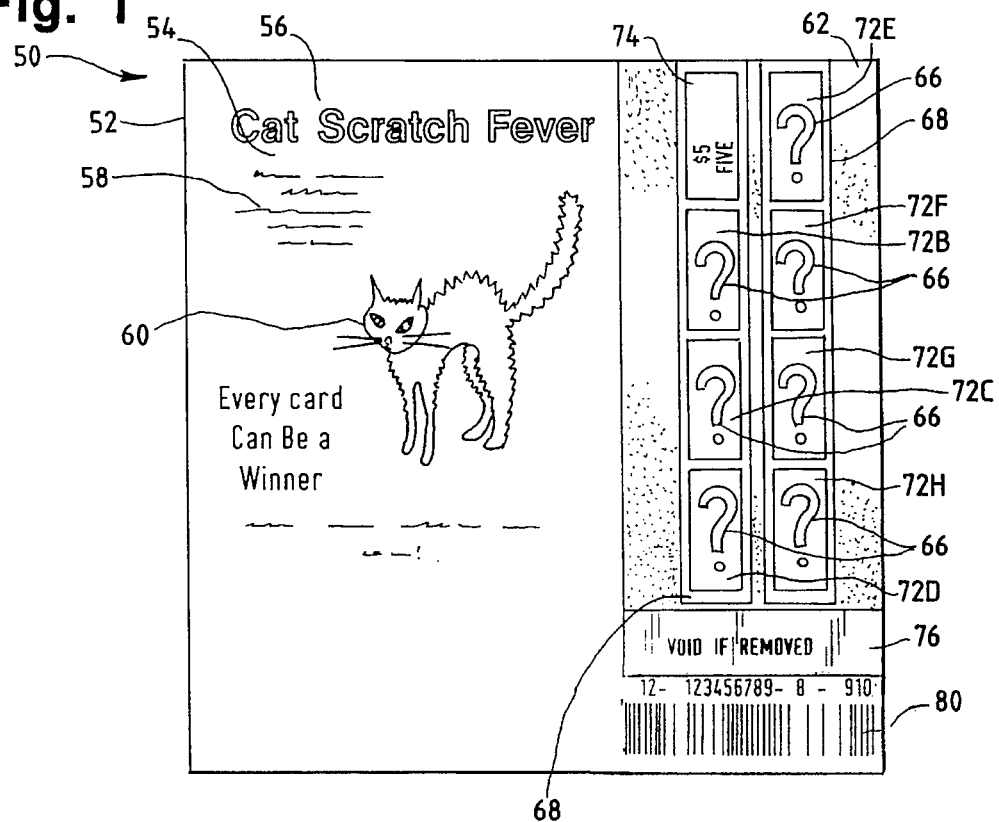
FIG. 1 is a plan drawing of a probability lottery ticket having an electrical signature according to the invention.

The present invention is directed to a method and to an interrelated group of devices for determining the authenticity and integrity of a document and includes printing a portion of an electrical circuit on the document. "Document", as that term is used herein, is not limited to conventional printed papers but includes any type of flexible substrate as well as rigid substrates such as printed circuit boards. A document is authentic if it is not the product of counterfeiting. The integrity of a document relates to its current physical state as compared to its initial physical state and is affected by unauthorized modifications or attempted modifications of the document by, for example, subjecting the document to chemicals, heat, light, or pressure. The electrical characteristics of the printed circuit provide the basis for determining both the authenticity and the integrity of the document. These characteristics can also be used to obtain data from the document.

The first step in the method is to choose a predetermined, measurable electrical property, for example, a known resistance, that will serve as the electrical signature of the document. Next, at least a portion of an electrical circuit is printed on the document using conductive or semi-conductive inks. The electrical circuit is designed so that when the circuit is completed, the circuit will generate an electrical signature that is substantially equal to a chosen predetermined electrical signature. Last, the circuit on the document is coupled to an external verification machine for determining the authenticity and integrity of the document by comparing the signal characteristics of the circuit on the document to the predetermined signature.

The external verification machine provides at least three functions. First, the external verification machine completes the circuit and provides a power source for exciting the circuit. Second, the external verification machine measures the resulting electrical signature of the document. And third, the external verification machine determines whether the measured electrical signature is substantially the same as the predetermined electrical signature. There are a number of ways in which the external verification machine can determine the authenticity and integrity of the document. The external verification machine can directly determine the authenticity and integrity of the document by using data directly available to the external verification machine. Alternatively, the external verification machine can indirectly determine the authenticity and integrity of a document by communicating the measured electrical signature to a remote computer which contains data related to the predetermined electrical signature for the document.

Determining the authenticity and integrity of the document is, in its simplest form, a logical progression. Generally, if an electrical signature can not be measured, the document is not authentic, is not in its original integral state, or both. On the other hand, if an electrical signature can be measured and the measured electrical signature is substantially the same as the predetermined electrical signature, the document can be assumed to be authentic and in its original integral state. If an electrical signature can be measured but is substantially different than the predetermined electrical signature, at the very least the document is not in its original integral state. The method will be explained in terms of a representative document which in this case is a probability game lottery ticket.

II. Probability Game Lottery Ticket Configuration

Because this example of the preferred embodiment of the invention is that of a probability game lottery ticket, a brief overview of that application is helpful. A probability game lottery ticket typically includes a group of play areas or play spots, each containing play indicia covered by an opaque material, usually a latex material. A player can win a prize if he removes the latex from a predetermined combination or combinations of play spots which define one or more winning redemption values. Generally the player is instructed to rub off only a specified number of play spots. Thus, a game may require a player to rub off three play spots. In this case, if the player rubs off more than three play spots, the ticket is void and the player automatically loses. If the play indicia under the removed play spots match one of the predetermined combination(s), the player is eligible to redeem the ticket for a prize. On the other hand if the removed play spots do not match one of the predetermined combination(s), the redemption value of the ticket will be zero.

FIG. 1 illustrates the final printed format of a probability game ticket 50 according to the invention. The ticket 50 includes a card substrate 52 which is generally divided into two portions. A first portion 54, the display portion, contains various types of printed information such as the name 56 of the probability game, information 58 related to the rules for playing the ticket, and customized art work 60. A second portion, the playing field portion 62, includes overprint areas 66, 68 and 76. The square overprint areas 66 define a group of play spot areas 72A–H of the ticket 50. As shown in FIG. 1, the overprint area of one play spot area 72A has been rubbed off reveal the underlying play indicia 74. The play indicia 74 can take on a variety of forms including, as shown here, a dollar value. The play indicia 74 can also be formed from letters or words alone, numbers alone, or symbols alone, or any combination of letters, numbers, or symbols. Although not illustrated, it is to be understood that play indicia similar to play indicia 74 underlie each of the play spot areas 72B–H.

The overprint area 76 defines the void-if-removed area of the ticket 50. A validation number 78, shown in FIG. 8, underlies the void-if-removed area defined by the overprint area 76. The validation number 78 contains various types of security information including a portion that is usually algorithmically related to the pack number and ticket number for a particular ticket, such as the ticket 50. The pack number identifies the pack from which the ticket 50 originates. The ticket number relates to the position of the ticket 50 within the pack. In addition as will be explained below, the validation number 78 can also include information related to the electrical signature(s) of the ticket 50. The validation number 78 is useful for determining the authenticity and integrity of the ticket 50, as explained in greater detail below, in Section V.

A bar code 80 is also printed within the playing field portion 62 of the ticket 50. The bar code 80 can include information related to the validation number, the pack and ticket numbers for the ticket 50 and to the redemption values of various combinations of the play indicia 74 in each of the play spot areas 72A–H. The bar code 80 can also be used to store information about the value of the play indicia 74 on the ticket 50, as is explained in greater detail below, in Section V.

Figure 2:
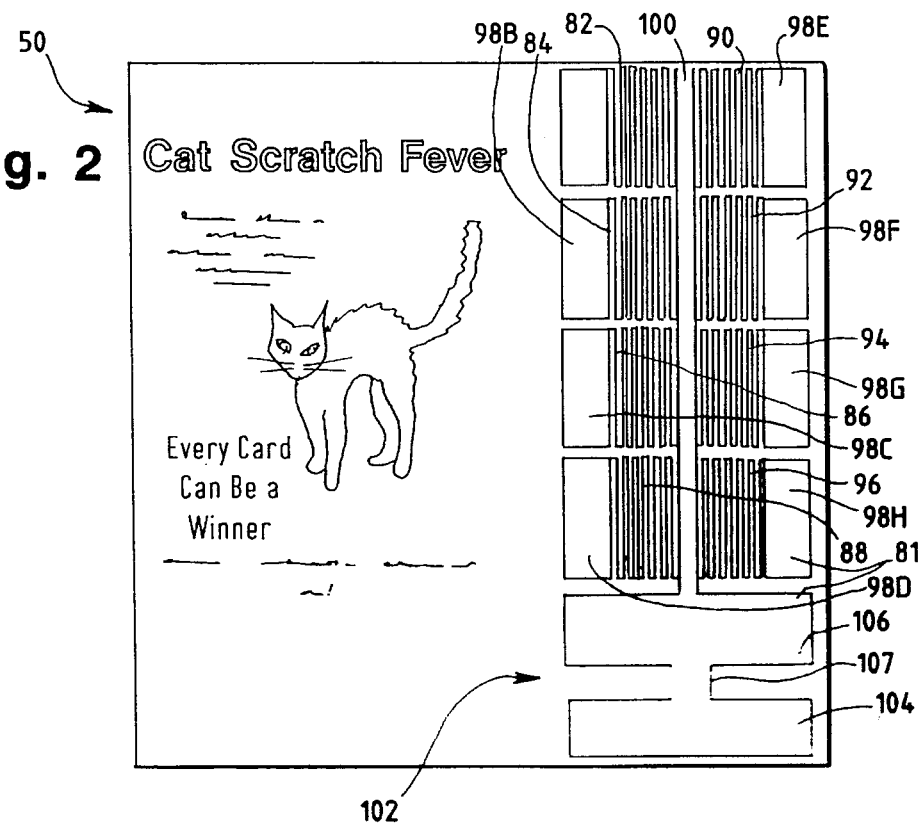
FIG. 2 is a plan drawing of the partial electrical circuit that provides the card in FIG. 1 its electrical signature.

FIG. 2. illustrates a partial electrical circuit 81 which is interposed between the overprint areas 64–68 and the play indicia 74 of the ticket 50 shown in FIG. 1. In the preferred embodiment, the circuit 81 includes eight resistor tracks 82–96 which are divided into two columns of four resistor tracks each. Each resistor track 82–96 underlies the overprint areas 68 shown in FIG. 1 which define each of the play spot areas 72A–H in FIG. 1. In addition, each resistor track 82–96 overlies a play indicia such as 74. Eight conductive or capacitive pick-up areas 98A–H are located around the periphery of the resistor tracks 82–96 and a central conductive track 100 is located between the two columns of resistor tracks 82–96. The central conductive track 100 is connected to a conductive I-track shown at 102 which includes a terminal conductive bar 104 and a second conductive bar 106 parallel to and spaced apart from the terminal conductive bar 104. A resistive track 107 connects the terminal conductive bar 104 to the second conductive bar 106. In the final printed format, such as that shown in FIG. 1, the terminal conductive bar 104 underlies the bar code 80.

Each resistor track 82–96 is electrically connected to the central conductive track 100 and to one of the conductive areas 98A–H, for example, resistor track 82 is electrically connected to central conductive track 100 and to conductive area 98A. The conductive areas 98A–H and the central conductive track 100 are used to capacitively couple the ticket 50 to an external verification machine 108, such as that illustrated in FIG. 14. In the preferred embodiment, each conductive area 98A–H acts as a capacitor plate, the other capacitor plate being provided by the external verification machine 108. In addition, the central conductive track 100 also acts as a capacitor plate, the second capacitor plate being provided by the external verification machine 108. The capacitive coupling of the conductive areas 98A–H and the central conductive track 100 to the external verification machine 108 completes the printed circuit 81 and permits the external verification machine 108 to excite the circuit and to measure the electrical signature or signatures of ticket 50. Since the capacitive coupling of the conductive areas 98A–H and the central conductive track 100 to the external verification machine 108 permits the external verification machine 108 to measure the electrical signature(s) of ticket 50, areas 98A–H and track 100 are also known as capacitive pick-up areas because through these areas the external verification machine 108 "picks-up" the electrical signature of ticket 50.

Because each of the resistor tracks 82–96 is electrically connected to both the central conductive bar 100 and to one of the conductive areas 98A–H, each of the resistor tracks 82–96 forms a complete circuit when the ticket 50 is coupled to the external verification device 108. Thus each of the resistor tracks 82–96 has its own electrical signature equal to the printed resistance of the resistor track. As shown in FIG. 2, each of the four resistor tracks in the two columns has the same resistance. Since each of the resistor tracks 82–96 is electrically connected to its associated conductive area 98A–H, the integrity of the eight circuits containing the eight resistor tracks 82–96 can be determined by reference to the specific conductive area 98A–H used to measure the electrical signature. Alternatively, each resistive track may have a unique resistance. For example, the resistor track 82 can have a resistance of 100 KΩ, the resistor track 84 can have a resistance of 300 KΩ, the resistor track 86 can have a resistance of 500 KΩ, and the resistor track 88 can have a resistance of 2,700 KΩ. Similarly, the resistor tracks 90–96 can have resistances of 100 KΩ, 300 KΩ, 500 KΩ, and 700 KΩ respectively. As is explained in greater detail in Sections III and IV.C.1., the magnitude of the resistance for a specific resistor track is a function of the type of ink used to print the resistor track, the length of the resistor track and the cross-sectional area, including the thickness, of the resistor track. Differences in the four resistances 82–88 or 90–96 in a given column of resistor tracks facilitate the determination of the authenticity and the integrity of the ticket 50 and more particularly can be used to determine which of the overprint areas 68 have been rubbed off.

Circuit 81, as shown in FIG. 2, is actually a composite of several layers used to print ticket 50. The following section describes in detail the sequence and relationship of the various layers used to print ticket 50.

III. Printing The Electrical Signature

In the preferred embodiment, the circuit 81 is printed onto the ticket 50 preferable via a gravure printing process. The gravure printing process allows for the widest range of ink and coating formulations. The gravure printing process, however, is not the only printing process that can be used to print the circuits. Gravure is only one type of intaglio printing process. Other types of intaglio printing processes can be used as well. In addition, the circuit 81 can be printed via screen printing, relief printing, planographic printing, letterpress and flexographic printing. In the preferred embodiment, the ticket 50 is printed on a paper substrate. Paper substrates are preferred because they offer good insulation and absorbency. Alternatively, the ticket 50 could be printed on a plastic or a metal, such as an aluminum foil, substrate. If a foil substrate is used, portions of the foil can serve as the main conductor for the ticket 50, while other portions of the ticket 50 are covered with an insulating layer.

Figure 3:
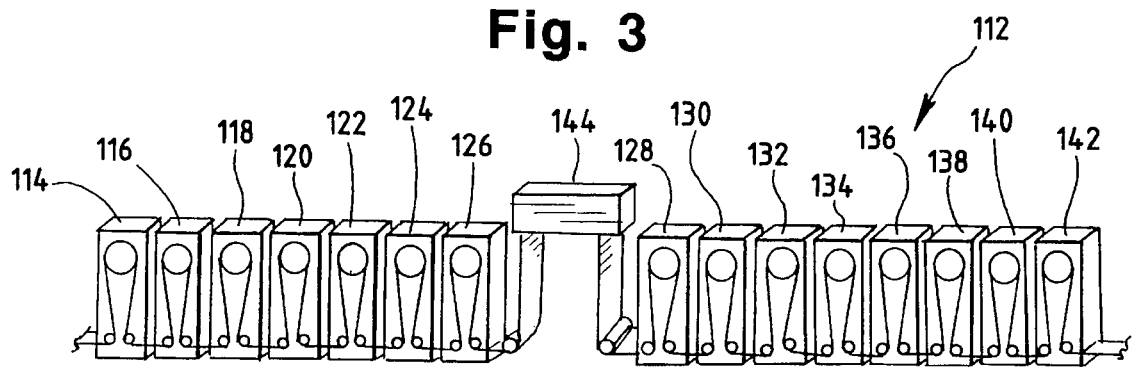
FIG. 3 is a schematic representation of a gravure printing press used to print the ticket in FIG. 1.

FIG. 3 is a schematic diagram representing a gravure printing press 112 suitable for printing ticket 50. The press 112 has fifteen gravure printing stations 114–142 and one ink jet station 144. As is explained in more detail below, each of the press stations 114–142 prints one layer on the ticket 50 while the ink jet printer 144 prints the play indicia 74 and the bar code 80.

Figure 4:
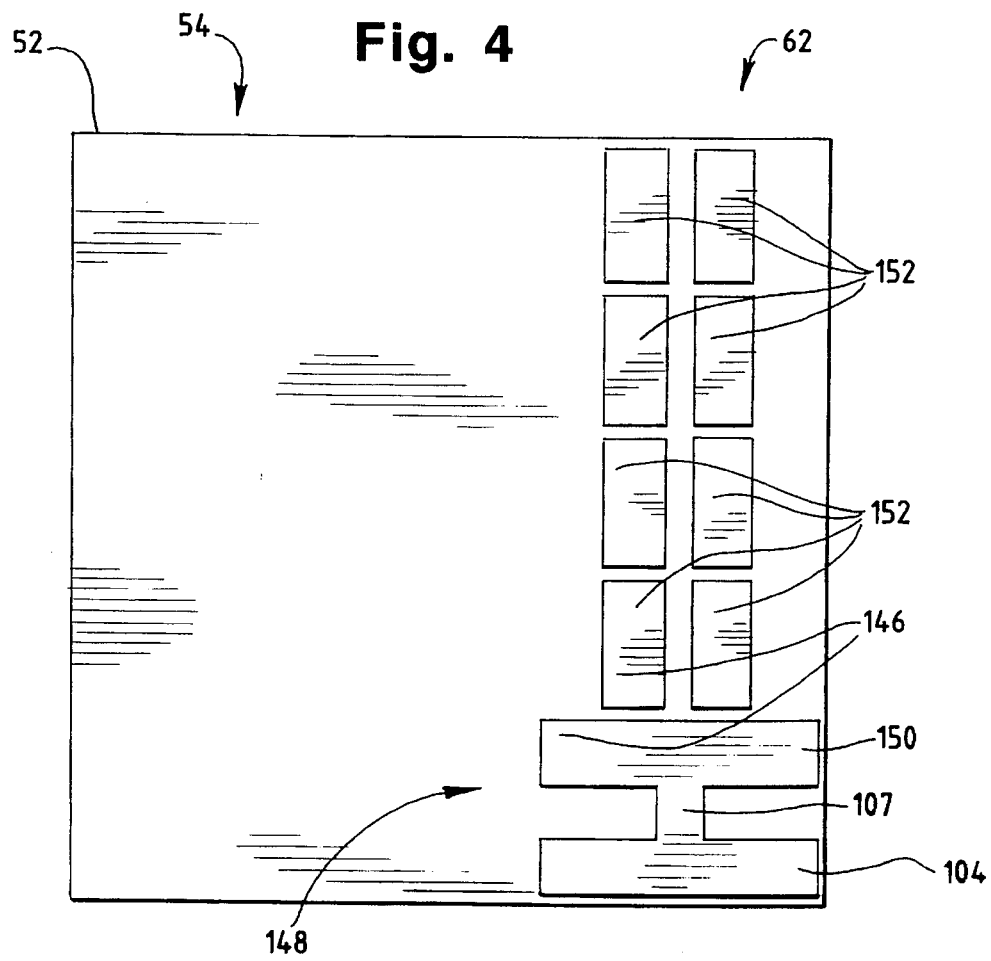
FIG. 4 is a plan drawing of the first layer printed on the ticket in FIG. 1.

Station 114 prints a first layer or surface 146 which is shown in FIG. 4. The first layer 146 is printed with a conductive-carbon based ink and forms a part of the circuit 81 shown in FIG. 2. The first layer 146 includes two portions the first of which is an I-track 148. The I-track 148 includes the terminal conductive bar 104 and the resistive track 107 which form part of the I-track 102 illustrated in FIG. 2. A second conductive bar 150 of the I-track 148 underlies the second conductive bar 106 of the I-track 102 of FIG. 2. The second portion of the first layer 146 consists of a pair of rows of blocking cells 152. Each of the blocking cells 152 is positioned to underlie one of the play indicia 74 which are subsequently printed on the ticket 50.

The ink used to print the layer 146 should have a sheet resistivity below 2,700 Ω/□ preferably in the range of 1,000 Ω/□ to 1,300 Ω/□. In the ticket 50 shown in FIGS. 1–13, the ink used to print the lower conductive layer 146 would most desirably have a sheet resistivity of 1,200 Ω/□. "Sheet resistivity" (ρ), as that term is used herein, is the bulk resistivity of the ink (ρ) divided by the thickness of the film of ink (t) printed on the ticket 50.

$$\rho s = \rho/t.$$

Sheet resistivity (ρs) will typically be expressed in terms of ohms/square (Ω/□). In practice, the sheet resistivity of an ink is determined by printing and measuring the resistance of a unit length and width.

The resistance (R) of a specific resistor in turn is a function of the bulk resistivity of the material and the dimensions of the resistor:

$$R = \rho(l/tw)$$

where ρ is the bulk resistivity of the material used to make the resistor, l is the length of the resistor, t is the thickness of the resistor and w is the width of the resistor. Substituting the previous equation for sheet resistivity into the equation for resistance yields the following:

$$R = \rho s(l/w)$$

Thus, the resistance of a resistor printed with a conducting or semi-conducting ink is a function of the sheet resistivity of the ink, the length of the printed resistor, and the width of the printed resistor. For example, the resistance of a printed resistor with an ink having ρs=100 Ω/□ which is 0.120 inches (0.3048 cm) long and 0.040 inches (0.1016 cm) wide would be:

$$R = \rho_s(l/w) = 100 \, \Omega/\square (0.0120/0.040) = 300 \, \Omega.$$

The ink used to print the first layer 146 should also have very good adhesive properties so that the layer 146 adheres well to the ticket 50 and should have good abrasion resistance properties so that the layer 146 is not easily rubbed off the ticket 50. A preferred formulation for the ink used to print the first layer is given in Table 1.

TABLE 1

Preferred Ink Formulation For Layer 1

| material | wt % |
| --- | --- |
| Acrylic Resin | 12–18% |
| Pentaerythritol ester of modified rosin | 2–6% |
| Conductive carbon | 14–20% |
| Polyamine amide/acidic ester dispersant | 0.3–1.0% |
| 2-ethylhexyl diphenyl phosphate plasticizer | 2–5% |
| Anhydrous ethyl alcohol | 20–30% |
| Normal Propyl acetate | 23–33% |
| 50/50 mixed solvent, normal propyl acetate and ethyl alcohol | |
| 950 varnish | 5% |

The 950 varnish comprises 36.24% normal propyl acetate, 24.92% DM55 acrylic, 12.92% pentalyn 830, 17.92% nitro varnish, and 3% santicizer 141. The preferred formulation provides a film former, solvent based ink. Film formers are polymers capable of being plasticized to form a continuous and totally flexible ink. In the preferred formulation, the solvent evaporates from the printed surface during drying leaving a continuous, conductive dry ink film. Preferably, the conductive carbon will be about 2–20µ in size in this formulation.

The first layer 146 serves at least two purposes. First, the solid black nature of the blocking cells 152 of the first layer 146 serves to prevent unauthorized detection of the play indicia 74, for example, by shining a bright light through the ticket 50. Second, the I-track 148 can be used to protect the bar code against unauthorized modifications, by providing an electrical signature for the bar code 80 which can be measured by the external verification machine 108. It should be noted that in some cases, especially where the ticket 50 does not include the blocking cells 152, it may be desirable to print an opaque blocking layer between the substrate 52 and the play indicia 74.

Figure 5:
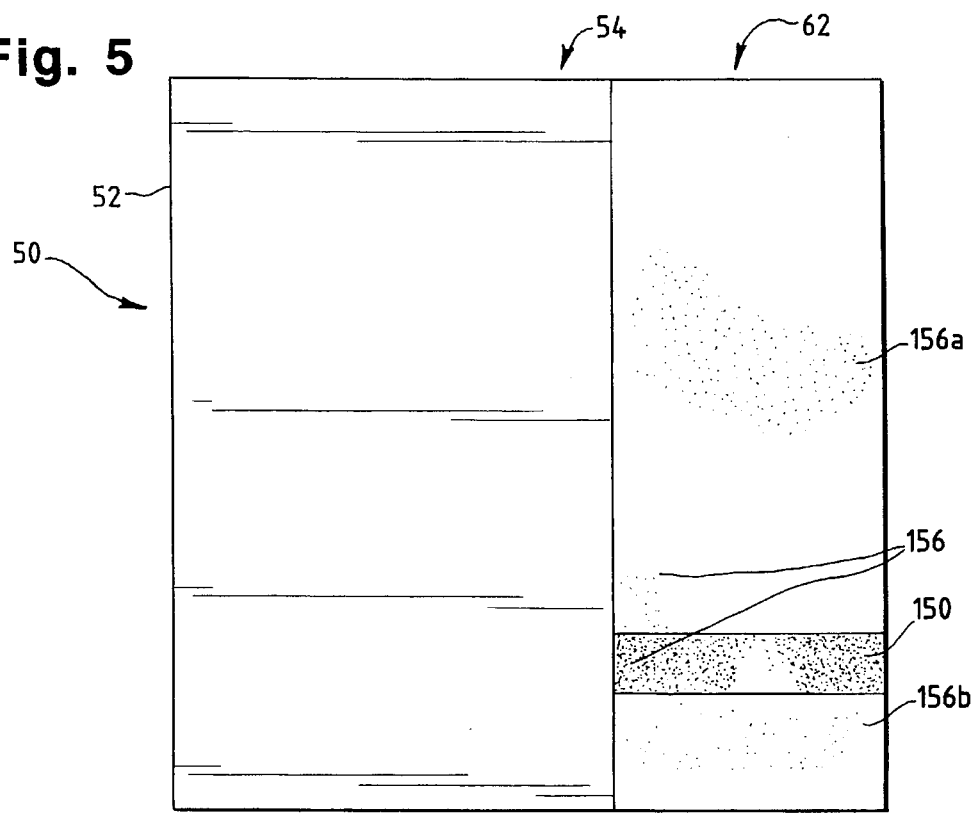
FIG. 5 is a plan drawing of the second layer printed on the ticket in FIG. 1.

Station 116 prints the second layer 156 which is shown in FIG. 5. The second layer 156 has two portions: an upper portion 156a and a lower portion 56b. The upper portion 156a overlies all of the blocking cells 152 of the first layer 146 shown in FIG. 4. The lower portion 156b overlies the terminal conductive bar 104 and the resistive track 107 of the I-track 148 of the first layer 146. The gap between the upper portion 156a and the lower portion 156b exposes the second conductive bar 150 of the I-track 148 of the first layer 146. The second layer 156 acts as a blocking layer to prevent the first layer 146 from obscuring observation of the play indicia 74 when the ticket 50 is played. A suitable formulation for the second blocking layer 156 is disclosed in U.S. patent application Ser. No. 08/004,157 the entire disclosure of which is hereby incorporated by reference.

Figure 6:
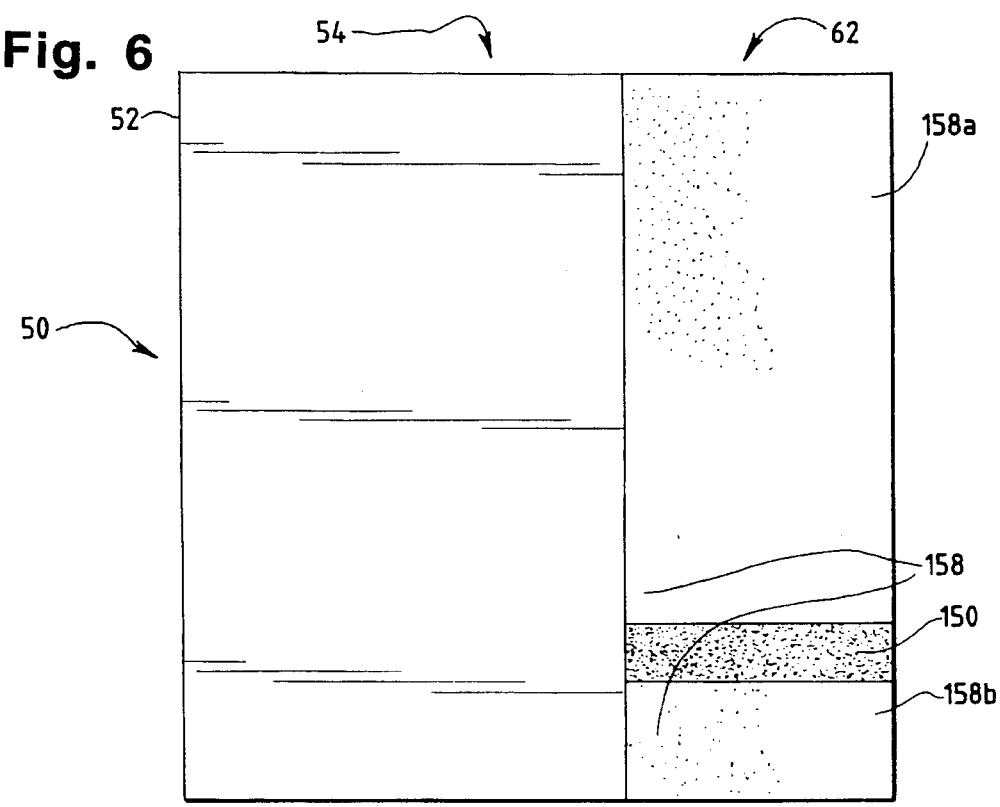
FIG. 6 is a plan drawing of the third layer printed on the ticket in FIG. 1.

A third layer 158 is then printed by the printing station 118. The placement of the third layer 158 is essentially coincident with the second layer 156, as shown in FIG. 6. The third layer 158 also includes a upper portion 158a and a lower portion 158b separated by a gap which exposes the second conductive bar 150 of the I-track 148. The third layer 158 is a primer layer which provides a suitable surface for printing the play indicia 74. A suitable formulation for the third primer layer is disclosed in Walton, U.S. Pat. No. 4,726,608.

Figure 7:
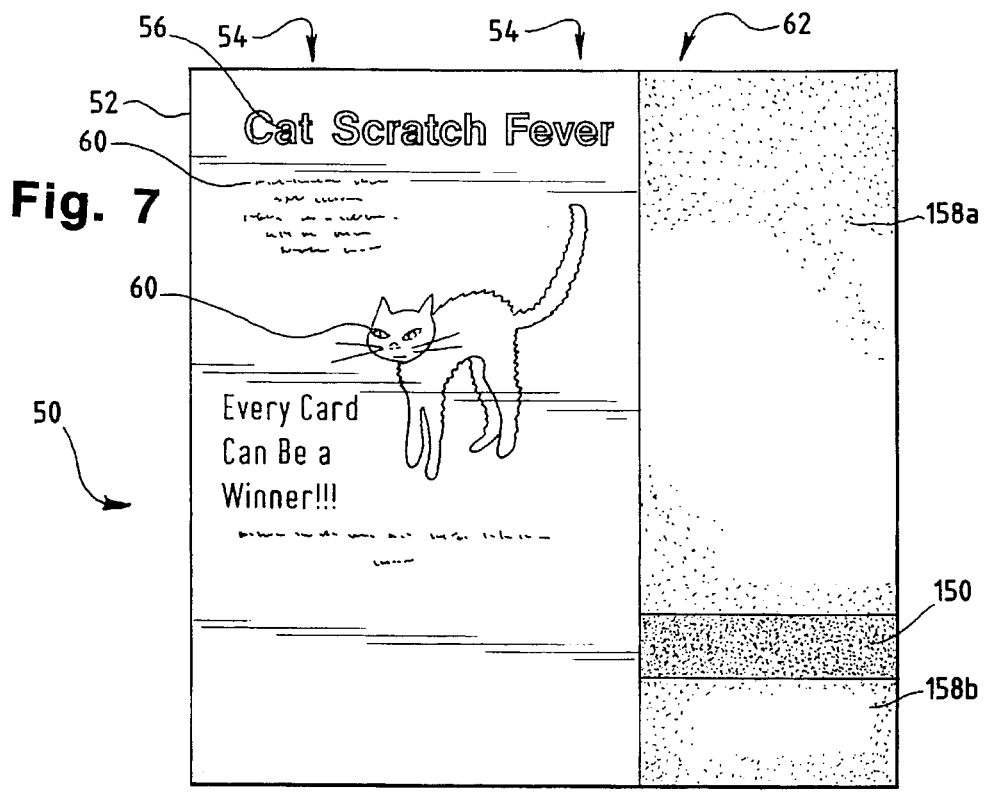
FIG. 7 is a plan drawing of customized graphics printed on the first portion of the ticket in FIG. 1.

Printing stations 120–126 provide the features printed on the display portion 54 of the ticket 50, as shown in FIG. 7. These printed features include the name 56 of the probability lottery game, information 58 related to the rules for playing the game, and customized art work 60. Because 4 different printing stations 120–126 are used to print these features, as many as four different colors of ink can be used to print process colors.

Figure 8:
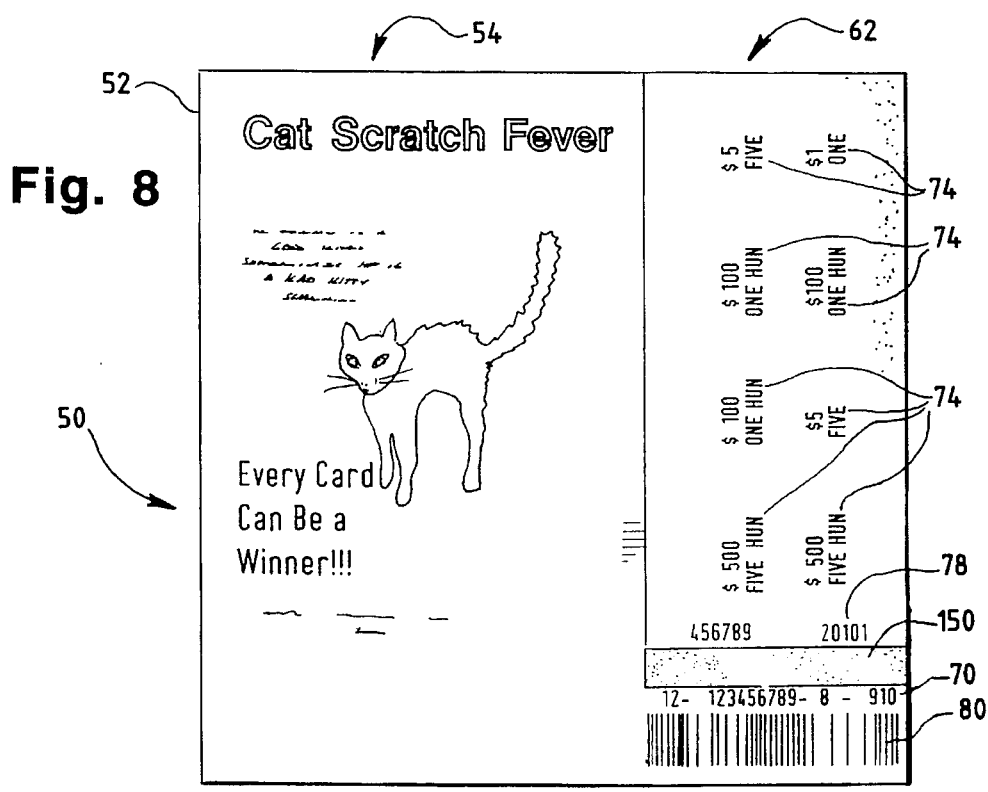
FIG. 8 is a plan drawing showing the placement of the play indicia, validation number, inventory control number, and bar code which are printed on the ticket in FIG. 1.

The ink jet printer 144 prints the play indicia 74 on a portion of the third layer 158, as shown in FIG. 8. In the preferred embodiment, there are two columns of play indicia 74, each of which contains four separate play indicia 74. The two rows of play indicia 74 are positioned so that each separate play indicia 74 overlies one of the blocking cells 152 of the first layer 146 shown in FIG. 4. The ink jet printer 144 also prints the inventory control number 70, the validation number 78, and the bar code 80 on the ticket 50. In the preferred embodiment, the inventory control number 70, the play indicia 74, the validation number 78, and the bar code 80 are printed with a water-based dye.

Figure 9:
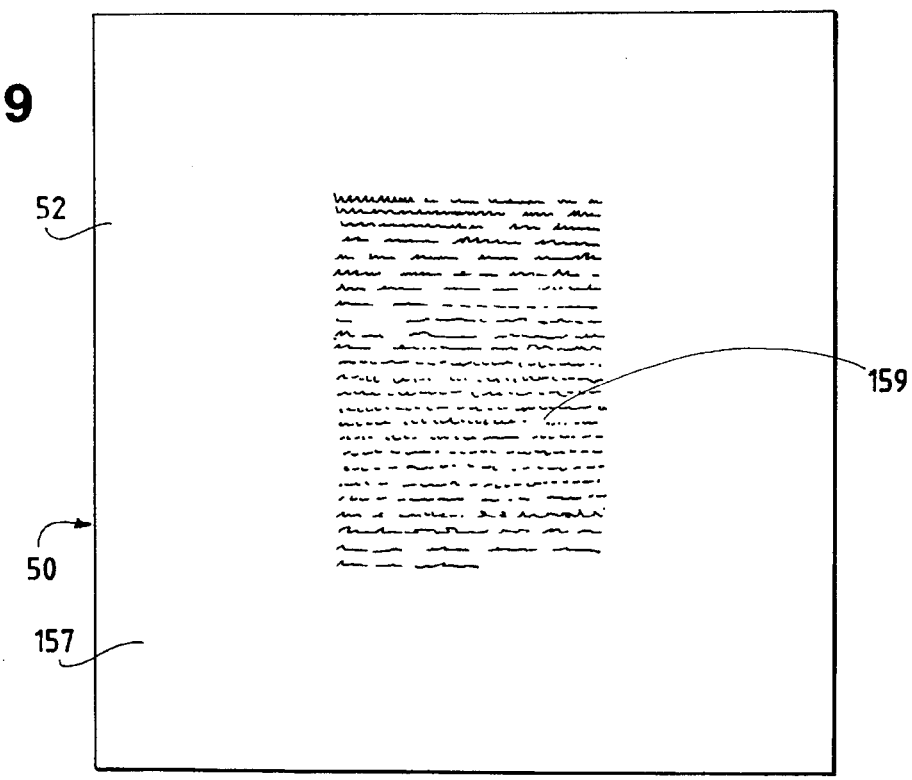
FIG. 9 is a plan drawing of the back of the ticket in FIG. 1.
Figure 10:
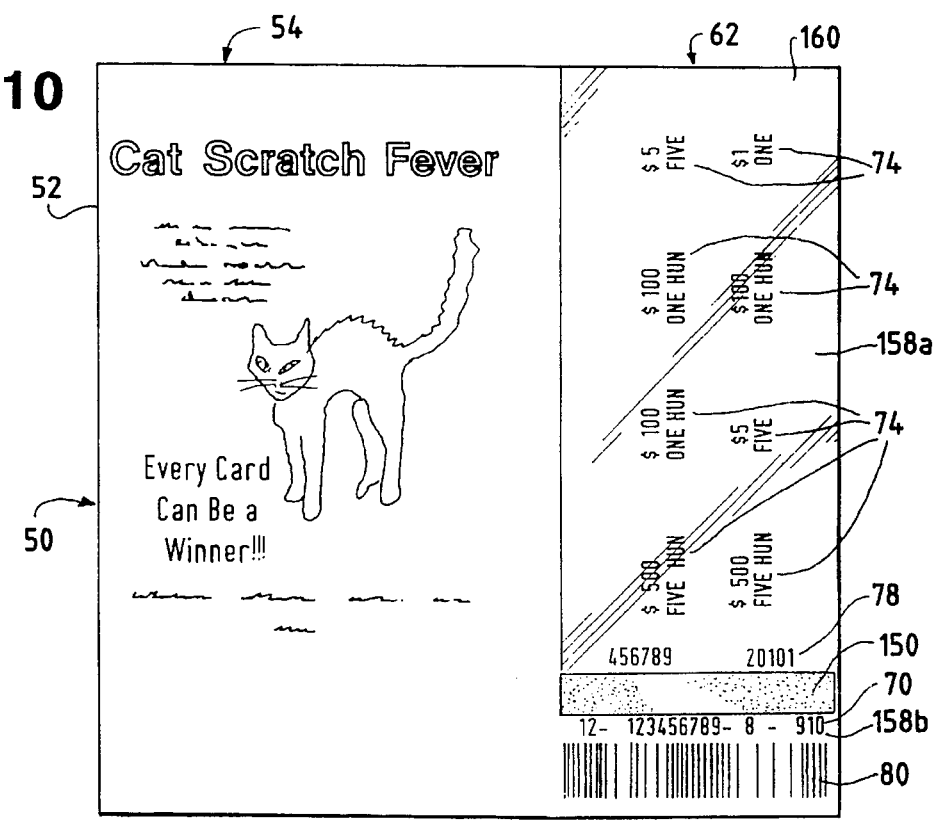
FIG. 10 is a plan drawing of the fourth layer printed on the ticket in FIG. 1.

Printing station 128 prints the back 157 of the ticket 50 as shown in FIG. 9. The back 157 may include additional information 159 related to the rules for playing the ticket 50.

The print station 130 prints a fourth layer 160 on the ticket 50. The fourth layer 160 is indicated by the shaded portions in FIG. 10. The fourth layer covers the upper and lower portions 158a, 158b of the third layer 158 shown in FIG. 7, and also covers the play indicia 74, the inventory control number 70, the validation number 78, and the bar code 80. In the same manner as the second and third layers 156 and 158, the fourth layer does not cover the second conductive bar 150 of the I-track 148. The fourth layer 160 is a seal coat which protects the inventory control number 70, play indicia 74, the validation number 78, and the bar code 80 from abrasion and from liquids in which the play indicia 74, the validation number 78, and the bar code 80 are soluble. Suitable materials for this purpose include various polymer materials such as acrylics, polyester urethane, epoxy acrylate, and vinyl polymer. A suitable formulation for the third primer layer 158 of FIG. 6 is disclosed in Walton, U.S. Pat. No. 4,726,608.

Figure 11:
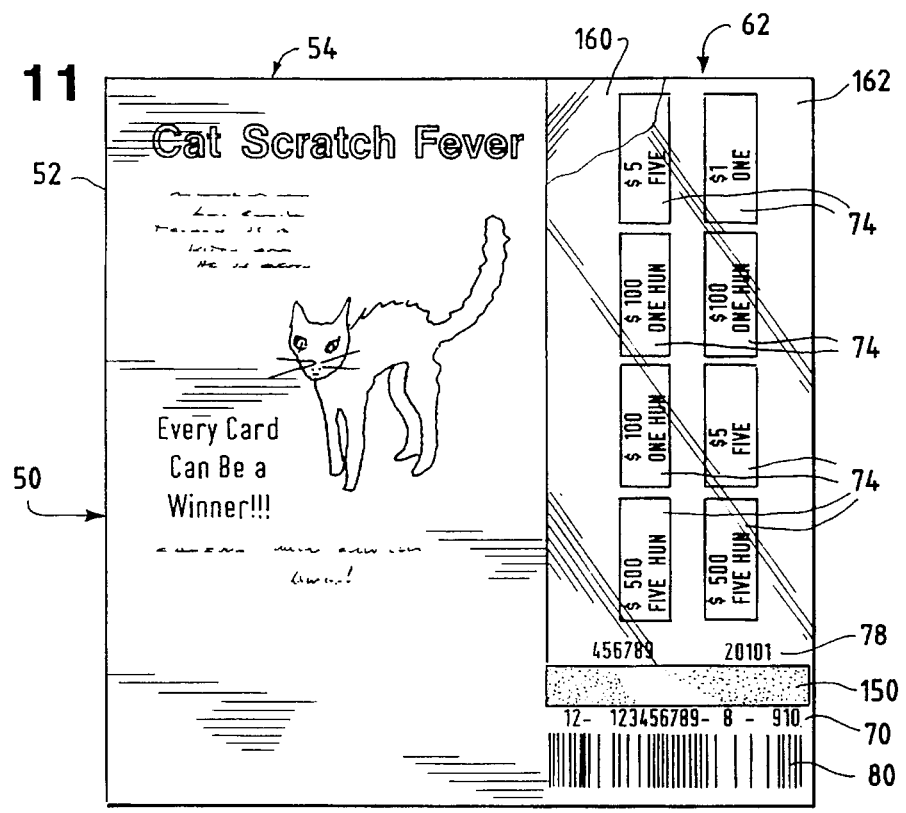
FIG. 11 is a plan drawing of the fifth and sixth layers printed on the ticket in FIG. 1.

The print stations 132 and 134 print a fifth and a sixth layer 162 on the ticket 50. As shown in FIG. 11, the fifth and sixth layers 162 are printed as discrete sections which overlie the play indicia 74 and the validation number 78. The fifth and sixth layers 162 are indicated by the shaded areas overlying the play indicia 74 and the validation number 78. The fifth and sixth layers 162 are both substantially transparent release coats which allow the play indica 74 to be viewed by the player and at the same time permit an easy removal of subsequent layers by, for example, rubbing the ticket 50 with a fingernail. The same release coat formulation may be used to print both the fifth and sixth layers 162. A suitable formulation for the third layer is disclosed in Walton, U.S. Pat. No. 4,726,608. Also, in some cases it may be desirable to use an ultraviolet curable seal-release coat in place of the release coats 162. Such seal-release coats are well known in the art.

Figure 12:
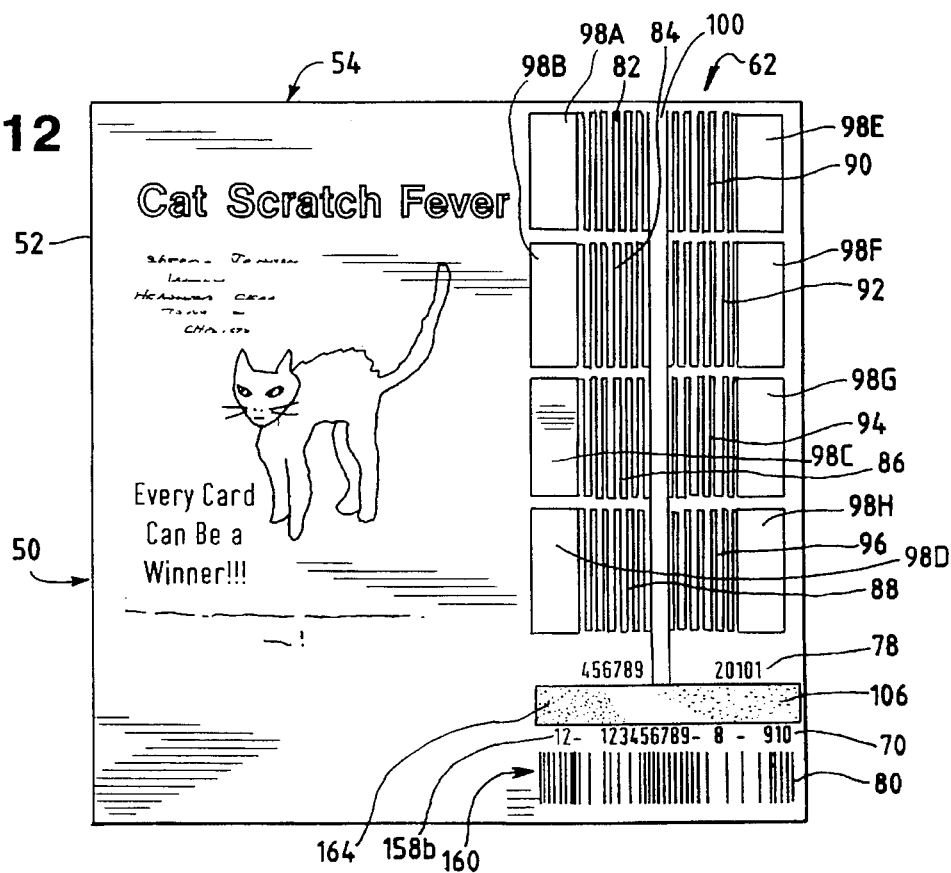
FIG. 12 is a plan drawing of the seventh layer printed on the lottery ticket on FIG. 1.

The print station 136 prints a seventh layer 164 which comprises the remainder of the electrical circuit 81 shown in FIG. 2 which is printed on the ticket 50. As illustrated in FIG. 12, the seventh layer 164 is a patterned layer which includes the resistor tracks 82–96 and the conductive areas 98A–H. The seventh layer 164 also includes the conductive bar 106 of the I-track 102 shown in FIG. 2. As explained earlier, the resistor tracks 82–96 are connected to the conductive areas 98A–H. The resistor tracks 82–96, as printed thus have electrical continuity with the conductive areas 98A–H and conductive track 100.

The relationship between the first layer 146 and the seventh layer 164 is better understood with reference to FIGS. 19 and 20 which are respectively plan drawings of the first layer 146 and of the seventh layer 164 alone. As noted earlier, the first layer 146, shown by itself in FIG. 19, consists of the blocking cells 152 and the I-track 148. The I-track 148 includes the terminal conductive bar 104 and the resistive bar 107. The seventh layer 164, shown by itself in FIG. 20, consists of the resistive tracks 82–96, the conductive areas 98A–H, the central conductive track 100 and the conductive bar 106. The seventh layer 164 is positioned on the ticket 50 so that the conductive bar 106 of the seventh layer overlies the conductive bar 150 of the first layer 146 to form the partial circuit 81 as illustrated in FIG. 2. The overlying relationship of conductive bars 106 and 150 ensures electrical continuity between the first layer 146 and the seventh layer 164.

It is desirable that the ink used to print the seventh layer 164 have a sheet resistivity at least in the range of 300 Ω/☐ to 600 Ω/☐ and preferably, the sheet resistivity should be below 300 Ω/☐. Several parameters can be varied to reduce the sheet resistivity of an ink. For example, the shape and size of the conductive particles affects the sheet resistivity of the ink. In addition, metal pigments tend to reduce the sheet resistivity as does a high pigment to binder ratio. However, both metal pigment and a high pigment to binder ratio tend to reduce the graphic adhesiveness of the ink. Unlike the ink used to print the first layer 146, the ink used to print the seventh layer 164 need not have exceptional adhesive properties because the seventh layer 164 or portions thereof are designed to be removed to reveal the play indicia 74 when the ticket 50 is played. Consequently, the ink used to print the seventh layer 164 on the ticket 50, or circuits on other types of documents where the adhesive qualities of the ink are not a major consideration, can include metal particles and can have a relatively high pigment to binder ratio. The use of metal particles in place of or in addition to carbon particles can substantiality increase the conductivity of the ink.

A preferred ink formulation for the seventh layer 164 is given in Table 2.

TABLE 2

| Preferred Conductive Ink Formulation For Layer 7 | |
| --- | --- |
| material | wt % |
| Acrylic resin | 10–15% |
| Pentaerythritol ester of modified rosin | 1–5% |
| conductive carbon | 5–15% |
| silver plated copper particles (5–10µ) | 10–25% |
| polyamine amide/acid ester dispersant | 0.25–0.75% |
| anhydrous ethyl alcohol | 25–35% |
| normal propyl acetate | 28–38% |

Although the preferred metal particles are sliver plated copper particles, other conductive metal particles such as aluminum, brass, nickel, iron and iron oxide particles can be used as well. However, it should be noted that nickel may not be suitable for use in certain types of documents since it can be toxic if ingested. Also, in addition to sliver, the metal particles can be plated with gold or tin.

Figure 13:
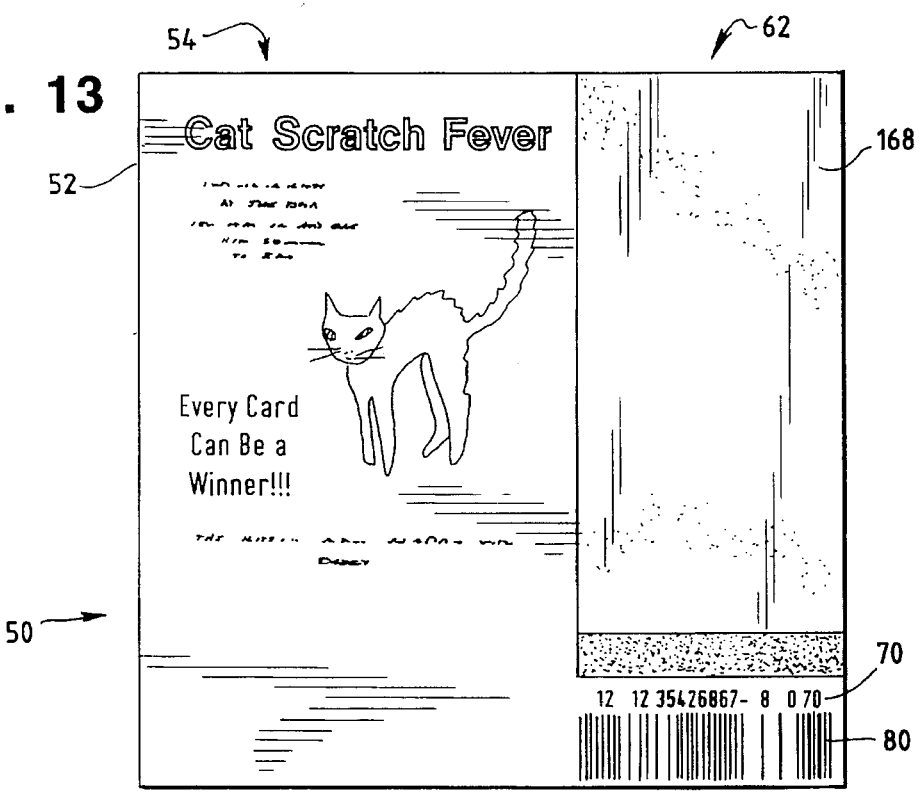
FIG. 13 is a plan drawing of the eighth layer printed on the lottery ticket in FIG. 1.

An eighth layer 168, preferably a scratch-off latex material, is applied at printing station 138. As shown in FIG. 13, the eighth layer 168 covers most of the playing field portion 62 of the ticket 50. The eighth layer 168 does not cover the inventory control number 70 or the bar code 80. The eighth layer 168 does, however, overlie the conductive bar 102 of the seventh layer 164. The final printing stations 138, 140, and 142 apply overprint graphics such as overprint areas 66, 68, and 76 illustrated in FIG. 1. The square overprint areas 68 serve to visually identify the individual play spot areas 72A–H and the overprint area 76, which overlies the validation number 78, is printed with the instruction "void if removed."

IV. Measuring The Printed Electrical Signature

A. The External Verification Machine

Figure 14:
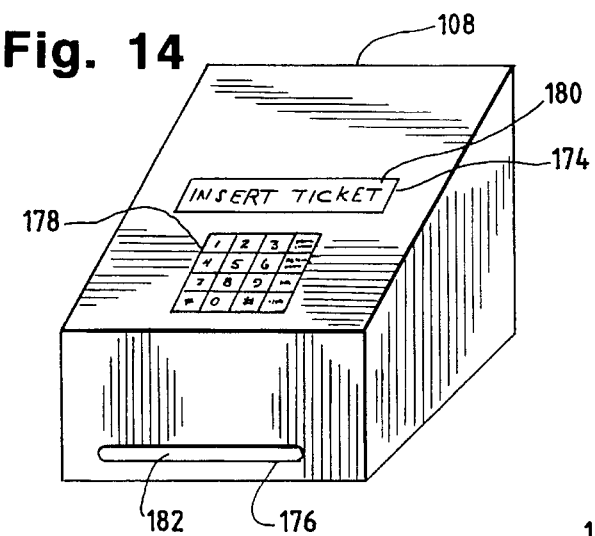
FIG. 14 is a perspective view of an external verification machine according to the invention.

As stated earlier, the circuit 81 on the ticket 50 is completed when the ticket 50 is capacitively coupled to the external validation or verification machine 108 which then can measure the electrical signature of the circuit elements such as resistors 82–96 on the ticket 50. FIG. 14 is a stylized perspective view of an exterior of the external verification machine 108. Although the exact configuration of the exterior of the external verification machine 108 can vary, the exterior of the preferred embodiment of the external verification machine 108 has three features: a results indicator 174, a ticket interface 176, and a user interface 178. As shown in FIG. 14, the results indicator 174 of the external verification machine 108 is a display panel 180. The display panel 180 can display the results of a ticket validation operation and can also display the results of verification testing, including tests of the authenticity and integrity of the ticket 50. The display panel 180 can also display instructions, such as "Insert Ticket", concerning the use of the external verification machine 108. In place of or in combination with the display panel 180, the external verification machine 108 can communicate with a printer 181 shown in FIG. 17 which can display the results of the ticket validation operation and verification testing as well. The user interface 178 can be a keyboard which the player or an agent can use to manually enter data from the ticket into the external verification machine.

Figure 18:
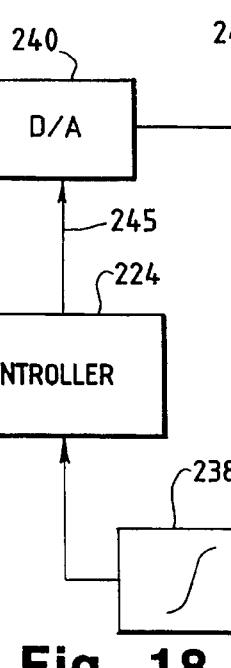
FIG. 18 is a block diagram of the circuitry of the external verification machine in FIG. 14.

A ticket interface 176 of the external verification machine 108 includes a ticket slot 182 into which the ticket 50 can be inserted. When the ticket 50 is properly inserted into the ticket slot 182, the conductive areas 98A–H, 100, and 106 are aligned with an array of capacitor plates 226A–H, 228 and 230, as shown in FIG. 18, located within the external verification machine 108, to complete the partial circuit 81 printed on the ticket 50. In addition, the bar code 80 is aligned with a bar code reader 210 (not shown) located within the external verification machine 108.

Figure 15:
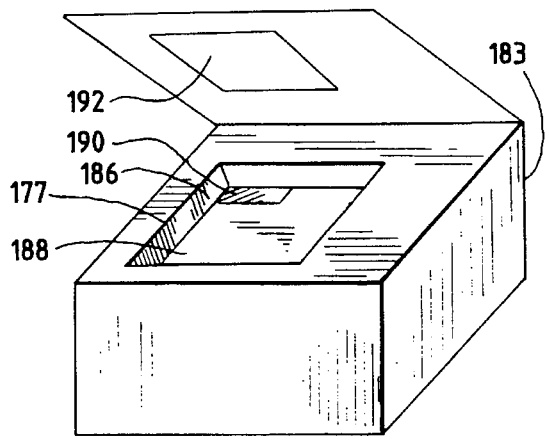
FIG. 15 is a perspective view of an alternative embodiment of an external verification machine according to the invention.
Figure 17:
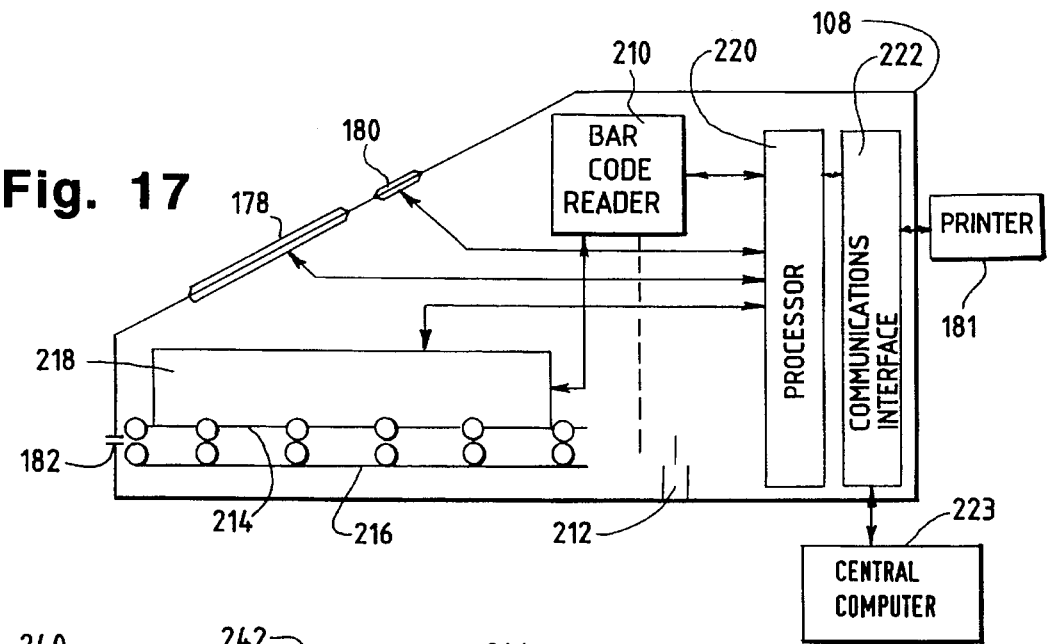
FIG. 17 is a block diagram of the major internal components of the external verification machine in FIG. 14.

FIG. 15 is a stylized plan drawing of an alternative embodiment of an external verification machine 183 having a different type of ticket interface 177. In this embodiment the external verification machine 183 has a hinged lid 184 which can be raised to expose the ticket interface 177 which includes a ticket recess 186. Within the ticket recess 186 is a sensor area 188 containing an array of capacitor plates (not shown) which align with the capacitor areas 98A–H, 100, and 106 on the ticket 50. The ticket recess 186 also includes a bar code reader area 190. The ticket 50 is placed within the ticket recess 186 such that the bar code 80 can be read through reader area 190 by a bar code reader 210 located within the external verification machine 183 as illustrated in FIG. 17. The external verification machine 183 can also have a second sensor area 192 also containing capacitor plates (not shown) which align with the conductive areas 98A–H, 100, and 106 on ticket 50.

Figure 16:
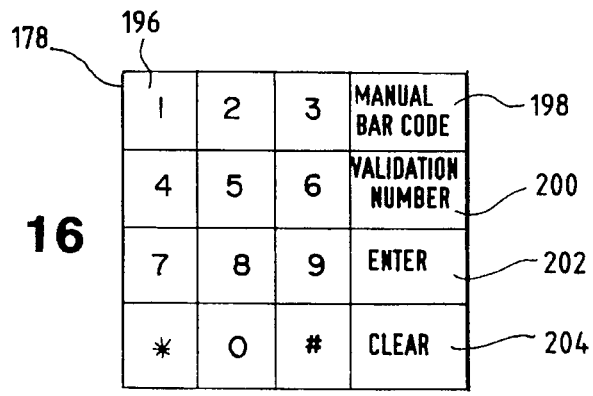
FIG. 16 is a plan drawing of the user interface of the external verification machine in FIG. 14.

FIG. 16 is a plan view of the preferred embodiment of the user interface keyboard 178. The user interface 178 includes a numeric key pad 196 and a set of operation keys 198–204. The operation key 200 is used to input the validation number 78 of the ticket 50 into the external verification machine 108 and the operation key 198 is used to manually input the bar code 80 of the ticket 50 into the external verification machine 108. Keying in of the bar code 80 may be necessary if the bar code reader 210 is not able to read the bar code because, for example, the bar code 80 is damaged or perhaps has been tampered with.

FIG. 17 is a sectioned side view which includes a block diagram of the major internal components of the external verification machine 108. The external verification machine includes the bar code reader 210, and a ticket sensor 212. The ticket sensor 212 senses when the ticket 50 has been properly inserted so that the bar code 80 can be read by the bar code reader 210. When the ticket is properly inserted the conductive areas 98A–H, 100, and 106 of the ticket 50 are aligned with a pair of sensor plates, indicated at 214 and 216, which include an array of copper capacitor plates 226A–H, 228 and 230, shown in FIG. 18, positioned in a configuration which mirrors that of the conductive or capacitor areas 98A–H, 100, and 106 of the ticket 50. The sensor plates 214, 216 are part of a sensor head 218 which contains a set of excitation and detection circuitry for the external verification machine 108. The external verification machine 108 also includes a processor board 220, including a microprocessor and memory, and a communications interface 222.

The excitation and detection circuitry of the sensor head 218 includes a microcontroller 224 with associated memory as shown in FIG. 18. The microcontroller 224 provides the necessary logic to control the external verification machine 108 and performs various tasks including controlling the communications interface 222, the user interface 178, and the bar code reader 210. The microcontroller 224 also processes the measured electrical signature of the circuit elements 82–96 on the ticket 50 that can be used to determine the authenticity and integrity of the ticket 50. Because the microcontroller 224 requires relatively little processing power, a single, self-contained IC can be used to provide inexpensive processing. Examples of acceptable chips include the Motorola 68HC711E9 and the Intel MCS®-51 Series microcontrollers. Each of these chips includes a Random Access Memory ("RAM"), a Programmable Read Only Memory ("PROM") and an Analog to Digital converter ("A/D").

As is explained in greater detail below, in Section V., the bar code 80 can include information regarding the value of the play indicia 74 of the ticket 50. The bar code reader 210 communicates directly with the microcontroller 224 via an ANSI standard interface, for example, UART. In the preferred embodiment, the bar code reader 210 is a laser scanner.

The communications interface 222 generally is a serial digital interface which may be a driver IC or a modem chip set. As is explained in more detail in Section V. below, the serial digital interface 222 allows the external verification machine 108 to communicate with a central host computer 223 when necessary to determine the authenticity or integrity of the ticket 50. In the preferred embodiment, a non-standard interface or a low-level encryption is included in the design of the serial digital interface 222 in order to enhance the security of communications between the external verification machine 108 and the central computer 223.

In operation, the excitation and detection circuitry of the sensor head 218 is capacitively coupled with the partial circuit 81 printed on the ticket 50 to complete the circuit 81. Thus, a complete circuit 225 including the partial circuit 81 on the ticket 50, as shown in FIG. 21, is completed 81 when the ticket 50 is placed within the ticket slot 182 in the sensor head 218. It should be noted that the excitation and detection circuitry can also be coupled to the ticket 50 by various other methods including: direct coupling, inductive coupling, radio frequency coupling and optical coupling, as described below in Section IV.E.

In the preferred embodiment, the sensor head 218 of the external verification machine 108 is capacitively coupled to the circuit 81 on the ticket 50 to complete the circuit 81. A block circuit diagram of the completed circuit 225 is shown in FIG. 21. As noted earlier, the conductive areas 98A–H, the central conductive track 100, and the conductive bar 106 function as capacitor plates. The sensor head 218 includes an array of the capacitive coupler plates 226A–H, 228 and 230, arranged in the same configuration as the conductive areas 98A–H, 100 and 106. When the ticket 50 is placed in the ticket slot 182, the capacitor plates 226A–H are aligned with the conductive areas 98A–H, the central conductive track 100, and the conductive bar 106 to form capacitors having an air gap dielectric. Alternatively, the capacitive couplers 226A–H, 228 and 230 could be arranged within the external verification machine 108 so that the capacitor plates 226A–H, 228 and 230 are positioned on the side of the ticket 50 opposite the conductive areas 98A–H, 100 and 106. In this configuration, the capacitors formed by coupling the capacitive couplers 226A–H, 228 and 230 to the conductive areas 98A–H, 100 and 106 would have a dielectric contributed both by the air gap and by the ticket substrate and printed layers located between the conductive areas 98A–H, 100, and 106 and the capacitor plates 226A–H, 228 and 230.

As noted earlier, each of the resistor tracks 82–96 is capacitively coupled in series to one of the capacitor plates 226A–H in the sensor head 218 via one of the conductive areas 98A–H. Similarly, a capacitor is formed by the capacitor plate 230 and the central conductive track 100. In addition, the bar code resistor track 107 is connected in series with the capacitor formed by the capacitor plate 228 in the sensor head 218 and the conductive bars 106 and 150 and to the capacitor formed by the conductive track 104 and the capacitor plate 228.

The capacitor plates 226A–H and 228 are connected to a pair of buffer amplifiers 232 and 236. The main buffer amplifier 236 supplies a signal to an integrator 238 in the external verification machine 108 which in turn supplies a signal to the microcontroller 224. The secondary buffer amplifier 232 provides a feed back loop to the capacitor plates 226A–H and 228 and hence the conductive areas 98A–H. The resistor tracks which are not currently being tested by the external verification machine 108 can produce stray capacitance which would interfere with the measured detection signal. To overcome this effect, the secondary buffer amplifier 232 applies the buffered detection signal to the resistor tracks which are not being tested, such as tracks 82–86, 90–96, and 107, to cancel out the effect of the stray capacitances.

The microcontroller 224 is also connected to a digital to analog ("D/A") converter 240 which supplies a signal to a voltage controlled oscillator ("VCO") 242. Because of the size constraints of a typical probability game ticket, such as ticket 50, the capacitance formed by coupling the individual resistor tracks, such as resistor track 88, to the excitation and detection circuitry is small. For example, a capacitor including a conductive track printed with the ink formulation described in Table 2 and having an area of 0.201869 inches$^2$ would have a capacitance of approximately 9 pF. Consequently, the excitation and detection circuitry includes an inductor 244 to oppose the effect of the capacitive impedance resulting from the small capacitance provided by coupling the capacitive pick-up areas 98A–98H and 104 to the external verification machine 108. The output from the VCO 242 is routed through the inductor 224 and applied to the central conductive track 100 via the excitation coupler 230.

When the ticket 50 is inserted into the external verification machine 108 and the microcontroller 224 is activated, the external verification machine 108 begins a discreet verification process for each resistor track 82–96 and 107. The microcontroller 224 steps an 8-bit output bus 245, which controls the D/A converter 240, from a value of 255 to zero. The DC output voltage from the D/A 240 is then applied to the VCO 242 for conversion to frequency. Thus, the microcontroller 224 produces a stepped series of decreasing excitation frequencies. These stepped excitation frequencies are routed though the inductor 244 and applied to the central conductive track 100 of the ticket 50 via the excitation coupler 230. The excitation signal from the VCO 242 is ultimately applied to each of the eight resistor tracks 82–96 and the bar code resistor track 107. The microcontroller 224 selects an individual resistor track, such as resistor track 88, through solid state switches (not shown) and routes the capacitively coupled detection signal to the dual buffer amplifiers 232 and 236. The main buffer amplifier 236 supplies a buffered voltage to the integrator 238 which converts the AC detection signal to a DC detection signal and applies this DC detection signal to the analog to digital input of the microcontroller 224 for processing.

In this embodiment, the external verification machine 108 uses a iterative resonance seeking algorithm to determine the measured electrical signature for each of the resistor tracks 82–96 and 107. Two registers (not shown), the resonance register and the temporary register, in the microcontroller 224 are used to store successive values of the detection signal. The detection signal is the signal produced when any of the resistor tracks, such as resistor track 88, is coupled to the external verification machine 108 and receives the excitation signal via the central conductive bar 100. The contents of both the resonance and temporary registers are initially set to zero.

The amplitude of the detection signal is ultimately converted to an eight-bit binary value via the integrator 238 and the A/D input of the microcontroller 224. The binary converted detection signal is then stored in the temporary register of the microcontroller 240. and the microcontroller 240 then compares the contents of the two registers. If the contents of the temporary register is less than the contents of the resonance register, the resonance register contains the binary converted equivalent of the amplitude corresponding to the resonance frequency of the resistor track being tested, such as track 88. Consequently, the frequency of the excitation signal and the contents of the resonance register are output to the processor 220 and in certain cases to the communication interface 222 which includes a RS-232 serial digital port. The output of the communication interface 222 which represents the electrical signature of the resistor track being tested can be transmitted to the central computer 223 or to a lottery terminal (not shown).

If the resonance frequency of the resistor track, such as track 88, is not detected, the above excitation and detection process is repeated. First, the contents of the temporary register are stored in the resonance register. Thereafter, the 8-bit output bus, which controls the D/A converter 240, is decremented to produce an excitation signal from the VCO 242 having a lower frequency than the previously applied excitation signal. The new excitation signal is applied to the ticket via the conductive track 100 and the new detection signal is compared, as previously described, with the contents of the resonance register. This excitation and detection process is repeated for each resistor track 82–96 and 107 until the detection signal corresponding to that associated with the resonance frequency of the resistor track being tested is determined.

B. Candidate Circuits For Providing The Electrical Signature

1. The T-Square Circuit

Several different types of circuit configurations can be printed on the ticket 50 to provide a measurable electrical signature. In the preferred embodiment, the printed circuit configuration 81, termed a T-square circuit, is illustrated in FIG. 2. As noted earlier, each of the resistor tracks 82–96 is electrically connected to one of the conductive areas 98A–H and to the central conductive track 100. FIG. 20 is a plan drawing of the partial printed circuit used to determine the authenticity and integrity of the play spot areas 72A–H and illustrates the resistor tracks 82–96 connected to the conductive areas 98A–H and the central conductive track 100. In addition, the bar code resistor track 107 is electrically connected to the conductive bars 104 and 106. FIG. 19 is a plan drawing of the partial printed circuit used to determine the authenticity and integrity of the bar code 80 and illustrates the bar code resistive track 107 connected to the conductive areas 104 and 150. As noted earlier, the first layer 146 printed on the ticket 50 includes the bar code resistor track 107 and the conductive areas 150 and 104. Successive layers, up to and including the sixth layer 162, do not overlie the conductive area 150 thus leaving the conductive area 150 exposed. The seventh layer 166 consists of the partial printed circuit used to determine the authenticity and integrity of the play spot areas 72A–H, as shown in FIG. 20. The conductive bar 106 of the seventh layer 164 immediately overlies the conductive bar 150 of the first layer 146. Consequently, the partial circuit including circuit elements 82–96 and 98A–98H for the play spot areas 72A–H, shown in FIG. 20, and the partial circuit for the bar code 80, shown in FIG. 19, are electrically connected via the conductive bars 106 and 150. Thus, when the ticket 50 is coupled to the external verification machine 108, the excitation signal applied to the ticket 50 via the central conductive track 100 is also transmitted to the bar code resistive track 107 via the conductive bars 106 and 150. Therefore, the completed circuit 225 which is formed when the ticket 50 is capacitively coupled to the sensor head 218 via the conductive areas 98A–H, 100, 104, and 106 is actually nine different, separate circuits, one for each of the resistor tracks 82–96 and one for the bar code resistor track 107.

As is explained in Section V. below, the external verification device 108 tests the integrity of a specific resistor track, such as resistor track 88, by comparing the measured resistance to the resistance which should result from the undisturbed configuration of the resistor track as originally printed, that is, the predetermined electrical signature of the resistor track. If the play spot area overlying the resistor track, such as track 88, has not been altered, for example, rubbed off or lifted to reveal the underlying play indicia, the resistance measured by the external verification machine 108 will be substantially the same as the resistance which should result from the configuration of the resistor track 88 as originally printed. If, however, the play spot has been removed or lifted, the measured resistance will be substantially different than the predetermined electrical signature of the track 88.

The T-square circuit 200 can determine the authenticity and integrity of the ticket 50 as a whole, of the individual play spot areas 72A–H, and of the bar code 80. If no resistance can be measured for any of the resistor tracks 82–96, it can be assumed that either the ticket 50 is a counterfeit or that all of the play spot areas 72A–H have been rubbed off thereby rendering the ticket 50 void. Moreover, because the T-square circuit 200 provides a different individual circuit for each of the resistor tracks 82–96, the T-square circuit 200 can individually test the integrity of the individual play spot areas 72A–H.

For example, a particular probability game may require revealing three matching game indicia to win. In addition, the game rules may require that no more than three play spot areas be rubbed off to reveal the underlying indicia. Consider the hypothetical situation in which an individual presents the ticket 50 to a lottery agent for redemption because the individual has ostensibly rubbed off only three play spot areas and the indicia in the three play spot areas match. By pure visual inspection, the ticket 50 might appear to be a valid and winning ticket. However, when the ticket 50 is inserted into the ticket slot 182 of the external verification machine 108 to measure the resistance of the play spot areas 72A–H, the external verification machine 108 would determine that not only the measured resistances of the three rubbed-off play spot areas differ from the predetermined resistances for these play spot areas, but also that the measured resistance of other "non-rubbed-off" play spot areas differ from the predetermined resistances for these areas. This situation could arise, for example, when the individual removes the overprint areas 68 of these additional play spot areas to reveal the hidden indicia 74 and then attempts to replace the overprint areas 68 so that these play spot areas appear to not have been played. Thus, although visually the ticket 50 appears to be a valid winning ticket, the measure of the resistances 82–96 would indicate that more than three play spot areas have been removed and that therefore the ticket 50 is void. In addition, if the measured resistance of the bar code resistor track 107 is substantially different from the predetermined electrical signature for the bar code 80. it can be assumed that the bar code 80 has been tampered with as well.

2. The Binary Coupled Circuit

An alternative embodiment of a ticket 250 having a partial printed circuit 252, termed a binary coupled circuit, is shown in FIG. 21. The partial circuit 252 is analogous to the seventh layer 164 printed on the ticket 50. As with ticket 50, the partial circuit 252 is ultimately printed on a ticket substrate 254 preferably using a conductive ink of the type described in Table 2. Although not shown, it is to be understood that additional layers such as a lower conductive layer analogous to the first layer 146 of ticket 50, a blocking layer and a primer layer analogous to the second layer 156 and third layer 158 of the ticket 50, play indicia analogous to the play indicia 74 of ticket 50, a seal coat and release coats analogous to the fourth layer 160 and the fifth and sixth layers 162 of the ticket 50 are also printed on the ticket 250 between the substrate 254 and the partial circuit 252 in a manner similar to that used for ticket 50.

The ticket 250 includes a display portion 256 and a playing field portion 258. The display portion 256 is ultimately covered by a coating (not shown) suitable for receiving customized graphics (not shown) and information (not shown) related to the rules for playing the ticket 250. The playing field portion includes two columns of four, separately removable play spot areas 260–274. Within the playing field portion 258, the partial circuit includes several conductive areas 276–292 and eight resistor tracks 294–308. Each of the play spot areas 260–274 is positioned between two conductive areas, for example, play spot area 260 is positioned between conductive areas 276 and 278 and play spot area 262 is positioned between conductive areas 278 and 280. Each of the resistor tracks 294–308 is also positioned between and electrically connected to two of the conductive areas 276–292. For example, resistor track 294, associated with play spot area 260, is positioned between and connected to conductive areas 276 and 278. Underlying each of the play spot areas 260–274 is a conductive line (not shown). Each conductive line is connected to the two conductive areas associated with its respective play spot area and resistor track. For example, the conductive line underlying play spot area 260 is connected to conductive areas 276 and 278.

The three additional conductive areas 310–314 are printed in the display portion 256 of the ticket 250. The first conductive area 310 is connected to the first column of four play spots 269–266 via a conductive track 316 connected to the conductive area 284. The second conductive area 312 is connected to the second column of four play spots 268–274 via a second conductive track 318 connected to the conductive area 292. All eight play spot areas 260–274 are connected to the third conductive area 314 via a third conductive track 320 connected to the conductive area 276. The conductive areas 310–314 serve as capacitor plates when the ticket 250 is coupled to an external verification machine.

Each column of four play spot areas 260–266 and 268–274 forms one complete circuit when the ticket 250 is coupled to the external verification machine 108. The excitation signal from the external verification machine 108 is routed through each group of four play spot areas 260–266 via the common conductive area 314 in the display portion 256 of the ticket 250. Each group of four play spot areas 260–266 and 268–274 provides its own detection signal. The detection signal for the play spot areas 260–266 is coupled to the external verification machine 108 via the conductive track 316 and the conductive area 310. The detection signal for play spot areas 268–274 is coupled to the external verification machine 108 via the conductive track 318 and the conductive area 312.

Within a group of four play spot areas, for example play spot areas 260–266, the magnitude of the detection signal varies with the integrity of each of the play spot areas 260–266. If the play spot areas 260–266 are intact, the excitation signal is substantially unaltered and is routed through the conductive lines underlying each of the play spot areas 260–266. However, if a play spot area has been rubbed off or lifted to reveal the underlying play indicia, the signal is routed through the resistor track associated with that play spot area. For example, if play spot area 260 is intact, the signal proceeds through the underlying conductive bar to the conductive area 278. However, if the play spot area 260 has been at least partially removed to reveal the underlying play indicia, the circuit through the conductive line is broken thus routing the signal through the associated resistor track 294 thus changing the characteristics of the detection signal.

In the preferred embodiment of this ticket 250, each of the resistor tracks associated with a group of four play spot areas, such as the resistor tracks 294–300 associated with play spot areas 260–266 has a unique predetermined resistance that is related, in a binomial progression, to the other resistor tracks in the column. For example, resistor track 294 can have a predetermined electrical signature equal to a resistance of 100 KΩ, resistor track 296 can have a predetermined electrical signature equal to a resistance of 200 KΩ, resistor track 298 can have a predetermined electrical signature equal to a resistance of 400 KΩ, and resistor track 300 can have a predetermined electrical signature equal to a resistance of 800 KΩ. The resistor tracks, such as resistor tracks 294–300, are printed in parallel to the conductive lines underlying the play spot areas, such as play spot areas 260–266. As explained below, the binomial relationship of the printed resistances for each resistor track within a group of four resistors tracks permits determination of the integrity of each play spot even though only one detection signal is produced for all four resistor tracks.

FIG. 22 is a partial schematic circuit diagram 324 illustrating the coupling of one column of four resistor tracks 260–266 to the excitation and detection circuitry of the external verification machine 108. The parts of the circuit which are contributed by the ticket 250 include the four resistor tracks 294–300, the conductive areas 276–284, the conductive lines 316 and 320, and the conductive areas 314 and 310. In addition, the ticket partial circuit includes four conductive lines 326–332 which underlie the play spot areas 260–266. The play spot areas 260–266 do not actually form a part of the circuit but are included in FIG. 22 for ease of understanding.

The remainder of the excitation and detection circuit is provided by the external verification machine 108, including a pair of capacitor plates 334 and 336. The capacitor plates 334 and 336 can consist of, for example, copper plates positioned within the external verification machine 108 to mirror the configuration of the conductive areas, such as conductive areas 310 and 314, on the ticket 250. When the ticket 250 is coupled to the external verification machine, the excitation and detection circuit is completed by the capacitive coupling of the capacitor plates 334 and 336 in the external verification machine with the conductive areas 314 and 318 printed on the ticket 250. The excitation signal is applied to the ticket 250 via one of the capacitors formed by one of the capacitor plates, for example the capacitor 334, with the conductive area 314 printed on the ticket 250. The detection signal is routed to the rest of the excitation and detection circuit via the capacitor formed by the other capacitor plate in the external verification machine, for example plate 338, with the conductive area 310 printed on the ticket 250.

When the play spots 260–266 have not been removed or tampered with, as illustrated in FIG. 22, the excitation signal flows through the each of the four conductive lines 326–332. However, removing or partially removing one of the play spots 260–266 effectively breaks the circuit through the associated conductive line rerouting the signal through the associated resistor track. For example, if play spot 260 is removed, the signal pathway would go through resistor track 294. Because each resistor track 294–300 has its own unique resistance, each resistor track 294–300 produces its own unique detection signal thereby permitting the external verification machine 108 to identify which, if any of the play spot areas 260–266 have been lifted or removed. Moreover, since the resistance values of the resistor tracks 294–300 are related to each other as a binomial progression, the external verification machine 108 can also identify which of the play spots 260–266 have been removed when two or more of the play spots 260–266 have been removed. For example, if both play spots 260 and 262 are removed the combination of resistor tracks 294 and 296 adds 300 KΩ to the excitation and detection circuit. However, if play spots 260 and 264 are removed, the combination of resistor tracks 294 and 298 adds 500 KΩ to the excitation and detection circuit. Thus, because the resistor tracks 294–300 have resistance values that are related as a binomial progression, each possible combination of resistor tracks 294–300 results in a unique total resistance which can be used to identify the play spots 260–266 that have been removed. Table 3 lists all the possible combinations of resistor tracks 294–300 and the resulting resistance values for the previously identified resistance values for the resistor tracks 294–300.

TABLE 3

| Resistor Combinations | |
|---|---|
| Resistors In The Circuit | Effective Resistance |
| R1 | 100 |
| R2 | 200 |
| R3 | 400 |
| R4 | 800 |
| R1 + R2 | 300 |
| R1 + R3 | 500 |
| R2 + R3 | 600 |
| R1 + R2 + R3 | 700 |
| R1 + R4 | 900 |
| R2 + R4 | 1000 |
| R1 + R2 + R4 | 1100 |
| R3 + R4 | 1200 |
| R1 + R3 + R4 | 1300 |
| R2 + R3 + R4 | 1400 |
| R1 + R2 + R3 + R4 | 1500 |

Additional resistance values and combinations of resistance values are possible. For example, the resistance values in Table 3 could be increased or decreased by an order of magnitude. The principle of this circuit design is that the individual resistance of each resistor track within a group of resistor tracks, such as resistor tracks 294–300, should be algorithmically related to the resistances of the other resistor tracks within the group so that every combination of resistor tracks provides a unique total resistance. Preferably, the individual resistances should vary as a binomial progression.

3. The Infinite Resistance Circuit

Figure 23:
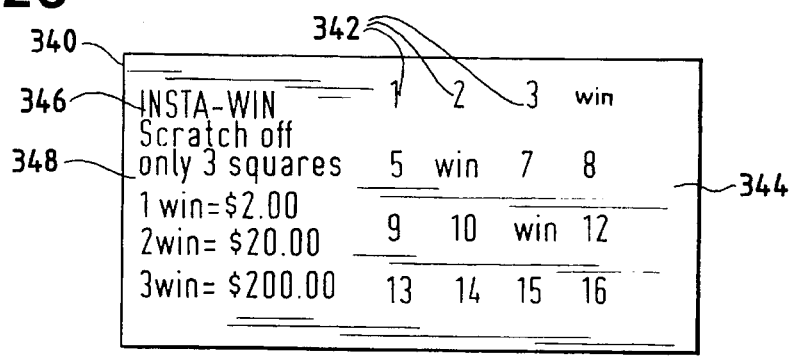
FIG. 23 is a plan drawing of a probability lottery ticket before the ticket is printed with yet another partial circuit which be used to determine the authenticity and integrity of the ticket.
Figure 24:
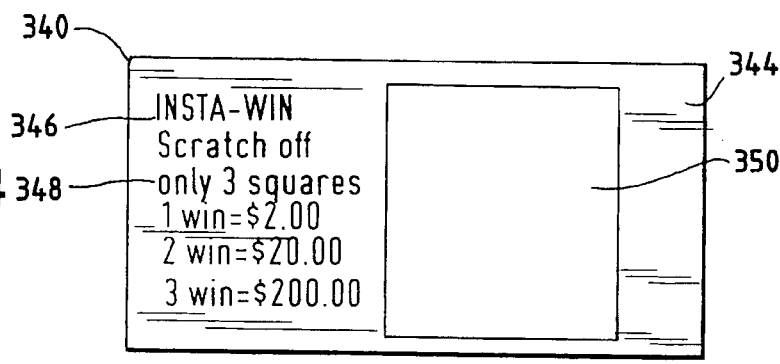
FIG. 24 is a plan drawing of the release coat printed on the ticket in FIG. 23.
Figure 25:
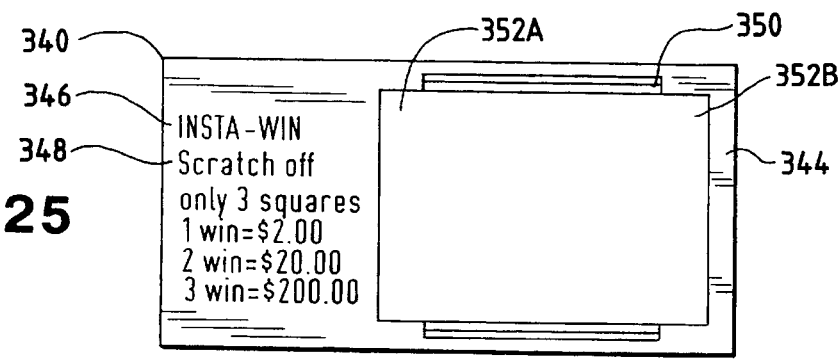
FIG. 25 is a plan drawing of the partial circuit used to determine the authenticity and integrity of the ticket in FIG. 23.
Figure 26:
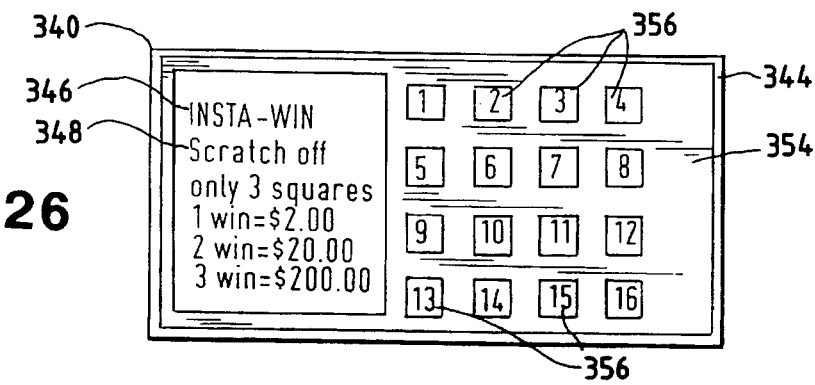
FIG. 26 is a plan drawing of the ticket in FIG. 23 in its final printed format.

FIGS. 23, 24, 25 and 26 illustrate another partial printed circuit which can be used to validate and determine the authenticity and integrity of a document which in this example is a lottery ticket 340. As shown in FIG. 23, the lottery ticket includes play indicia 342 which are printed over the ticket substrate 344. Additional information, such as the name of the lottery game 346 and rules 348 for playing the ticket are also printed on the ticket substrate 344. FIG. 24 is a plan drawing of the scratch-off coating 350 which is printed over and conceals the play indicia 342. The scratch-off coating 350 is a removable layer of a material such as latex which can be relatively easily removed to reveal the play indicia 342. A single block of scratch-off coating 350 is used to cover all of the play indicia 342. A release coat (not shown) coincident with the scratch-off coating 350 is also printed on the ticket 340 between the play indicia 342 and the scratch-off coating 350. FIG. 25 is a plan drawing of the partial printed circuit which is used to determine the integrity and authenticity of the ticket 340. The circuit consists of a single conductive area indicated at 352A and 352B which overlies the scratch-off coating 350. The two portions 352A, 352B of the conductive area extend beyond the edges of the scratch-off coating 350. FIG. 26 is a plan drawing of the ticket 340 in its final printed state which includes overprint areas 354 that conceal the scratch-off coating 350 and the conductive area 352, as well as overprint areas 356 that define the individual play spot areas.

When the ticket 340 is coupled to the external verification machine 108 the portions 352A and 352B serve as capacitor plates to couple the partial circuit printed on the ticket 340 with the excitation and detection circuitry in the external verification machine 108. The portion of the conductive track 352A–B which immediately overlies the scratch-off coating 350 but does not extend beyond the scratch-off coating 350 serves as a resistor track when the ticket 340 is coupled to an external verification machine 108. If the ticket is in its original integral state, the portion of the conductive area 352A–B immediately overlying the scratch-off layer 350 is electrically connected to the portions 352A and 352B which serve as capacitor plates. However, if an individual has attempted to surreptitiously inspect the play indicia 342 by, for example, lifting and then replacing the scratch-off layer 350, the electrical connection between the middle portion of the conductive layer and the end portion 352A and 352B would be broken resulting in an open circuit.

4. The Increased Resistance Circuit

Figure 27:
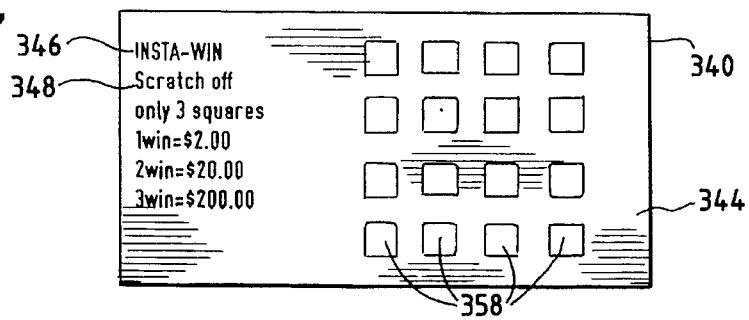
FIG. 27 is a plan drawing of a second embodiment of the release coat printed on the ticket in FIG. 23.
Figure 28:
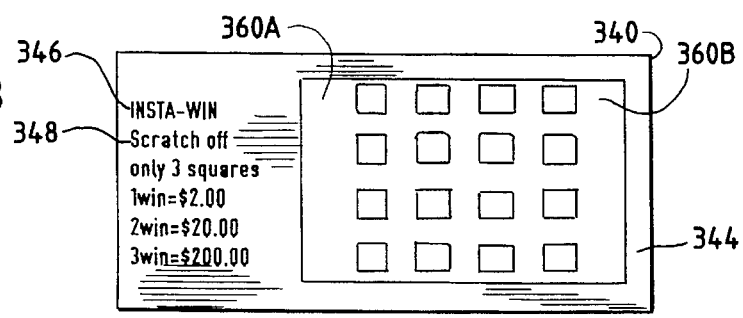
FIG. 28 is a plan drawing of the circuit used to determine the authenticity and integrity of the ticket in FIG. 23.

FIG. 27 illustrates an alternative embodiment of a scratch-off layer 358 for the ticket 340. Unlike the previously described scratch-off layer 350, the scratch-off layer 358 consists of discreet, individual areas which overlie each play indicia 342 (not shown). A release coat (not shown) underlies each of the discreet portions of the scratch-off coating 358. The partial printed circuit which overlies the scratch off layer 358 consists of a single conductive area indicated at 360A and 360B which overlies all of the scratch off layer 358. Two portions 360A, 360B of the conductive area 360 extend beyond the area of the ticket 340 containing the scratch-off coating 358. The final printed format of the ticket 240 is shown in FIG. 26 and includes overprint areas 354 that conceal the scratch-off coating 358 and the conductive area 360A–B, as well as overprint areas 356 that define the individual play spot areas.

When the ticket 340 is coupled to an external verification machine 108, the portions 360A and 360B of the conductive area 360 which extend beyond area of the ticket 340 containing the scratch-off layer 358 serve as capacitor plates to couple the partial circuit printed on the ticket 340 with the excitation and detection circuitry in the external verification machine 108. The portion of the conductive area 360A–B which immediately overlies the scratch-off coating 358 but does not extend beyond the scratch-off coating 358 serves as a resistor track when the ticket 340 is coupled to the external verification machine 108. If all of the play spots are intact, the electrical signature of the ticket 340 will be equal to the printed resistance associated with the portion of the conductive track 360 which overlies all of the play indicia 342. However, if an individual has attempted to surreptitiously inspect the play indicia 342 by, for example, lifting and then replacing one portion of the scratch-off layer 358, the small portion of the conductive area 360A–B immediately overlying the removed area of the scratch-off layer 258, will be electrically disconnected from the remainder of the conductive area 360A–B, leading to an increase in the resistance associated with the conductive area 360A–B.

5. The Waffle Circuit

Figure 29:
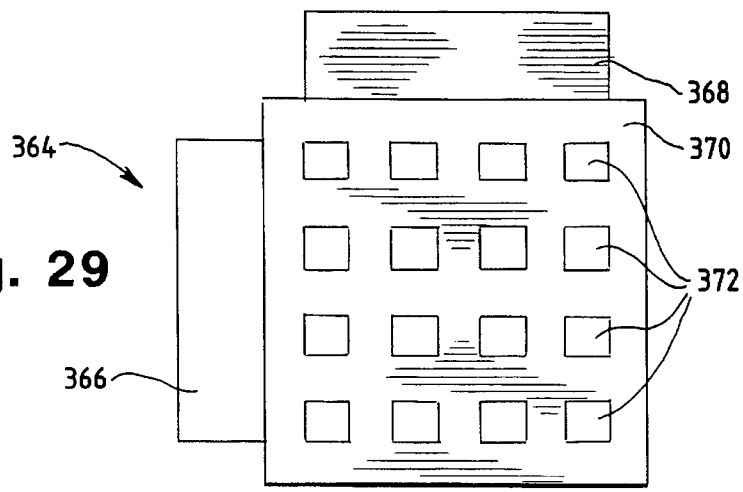
FIG. 29 is a plan drawing of another circuit which can be used to determine the authenticity and integrity of a probability game ticket.

FIG. 29 is a plan drawing of another partial circuit 364 which can be printed on a lottery ticket to determine the authenticity and integrity of the play spot areas. The partial circuit, termed a waffle circuit, includes two conductive bars 366 and 368 which are electrically connected to a conductive area 370 overlying the play indicia (not shown). Removable scratch-off areas 372 overlie the portions of the conductive area 370 which immediately overlie the individual play indicia. A seal coat and release coats analogous to the forth layer 160 and the fifth and sixth layers 162 of the ticket 50 in FIG. 11 are primed in an appropriate configuration between the play indicia and the conductive area 370. Thus, removal of any of the scratch-off areas 372 also removes a portion of the conductive area 370. When the ticket which includes the partial circuit 364 is coupled to the external verification machine 108, each of the play spot areas defined by the scratch-off areas 372 serves as a capacitor plate. In addition, the conductive bars 366 and 368 also serve as capacitor plates to couple the partial circuit 364 to the excitation and detection circuitry of the external verification machine 108. The excitation and detection circuitry of the external verification machine 108 in turn includes an array of capacitive couplers which are positioned to mirror the configuration of the conductive bars 366 and 368 and the scratch-off areas 372. Thus, in contrast to the previously described partial circuits in FIGS. 20., 21, and 23–28, the electrical signature of the play spot areas associated with the partial circuit 364 is a conductive track, rather than a resistive track.

The external verification machine 108 can check the authenticity and integrity of the play spot areas defined by the scratch-off areas 372 by applying an AC excitation signal to one of the conductive bars 366 or 368. If the individual play spot area being tested is intact, the excitation signal will be routed through the portion of the conductive area 370 underlying the scratch-off area 372 associated with the tested play spot area. Consequently, an AC detection signal will be routed to the capacitor plate in the external verification machine 108 which mirrors the particular play spot area 372. However, if the scratch-off area 372 being tested has been at least partially removed, the associated removal of a portion of the conductive area 370 creates an open circuit under that particular scratch-off area 372. Hence, no AC detection signal is routed to the associated capacitor plate in the external verification machine 108, indicating that the integrity of the play spot area 372 has been changed.

6. The Recursive Circuit

Figure 30:
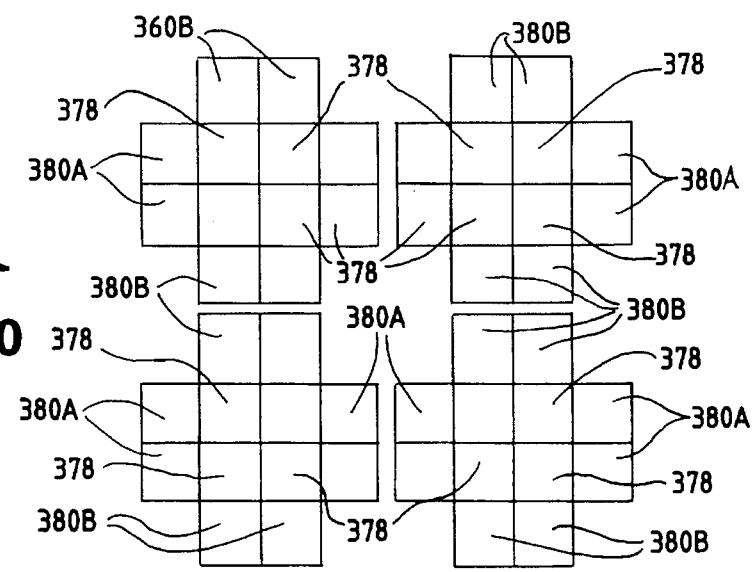
FIG. 30 is a plan drawing of another circuit which can be used to determine the authenticity and integrity of a probability game ticket.

FIG. 30 is another plan drawing of a partial printed circuit 376 which can be used to determine the authenticity and integrity of the play spot areas of a lottery ticket. The partial circuit 376 includes resistor tracks (not shown) which underlie each of the removable scratch-off areas 378. Each resistor track is electrically connected to a pair of conductive bars 380A and 380B. In the partial circuit shown in FIG. 30, there are a total of twenty-four conductive bars 380A, 380B, two for every resistor track associated with one of the scratch-off areas 378. When the ticket which includes the partial circuit 376 is coupled to an external verification machine 108, each resistor track associated with each scratch-off area 378 is capacitively coupled to the excitation and detection circuity of the external verification machine 108 by its associated conductive bars 380A and 380B. One conductive bar, for example, bar 380A, is used to apply the excitation signal to the resistor track. The second conductive bar, for example bar 380B, routes the detection signal to the rest of the excitation and detection circuitry in the external verification machine 108. If the scratch-off area 372 being tested is intact, the electrical signature of the associated resistor track will be substantially equal to the printed resistance of the resistor track underlying the scratch-off area 372. If, however, the scratch-off area 372 being tested has been at least partially removed or lifted, the measured resistance of the resistor track and hence the resonant frequency of the completed circuit associated with the scratch-off area 372 will be substantially different than the printed resistance of the resistor track.

C. Variation In Printed Resistances

1. Variations In The Printed Resistances

A number of the foregoing circuits, such as the T-square circuit shown in FIG. 20., and the binary-weighted circuit shown in FIG. 21, use the resistance of a printed resistor track to impart an electrical signature to a document. As noted earlier, the resistance of such printed resistor tracks can be defined as follows:

$$R = \rho(L/A)$$

where

R=resistance;

ρ=bulk resistivity (resistance per unit volume);

L=length of resistor; and

A=cross sectional area of the resistor.

The cross-sectional area of the resistor in turn equals the product of the print thickness (t) and the width (W) of the resistor. Substituting these parameters yields the following formula for the resistance of a printed resistor track:

$$R = \rho(L/tW)$$

Figure 31:
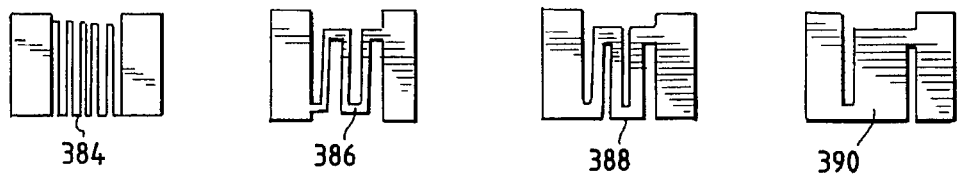
FIG. 31 is a plan drawing of four printed resistors having different resistances.

Thus the resistance of a printed resistor track such as those used in the previously described circuits is a function of the bulk resistivity of the ink used to print the resistor, the length of the resistor track, the thickness of the printed track and the width of the printed track. Resistor tracks having different resistances can thus be formulated by varying any of these parameters. In practice, changing the resistivity of the inks used in order to create different resistor tracks having different resistances may be impractical because, at least in a gravure printing process, changing inks requires using a different printing station. The other parameters, however, can be easily and effectively varied to provide different resistor tracks within one circuit which have different resistances. FIG. 31 is a plan drawing of four different resistor tracks 384–390. Because the length and widths of the resistor tracks 384–390 differ, the resistances of the resistor tracks 384–390 will be different even if the resistor tracks 384–90 are printed with exactly the same conductive ink. Thus, for example, the resistor tracks 386 and 388 would have different resistances even though the lengths of the resistor tracks 386 and 388 are approximately equal because the widths of the resistor tracks 386 and 388 are not the same. Thus, the resistance of the resistor tracks printed on a document, such as the ticket 50, can be varied by varying the dimensions of the printed resistor tracks.

2. Variations In The Measured Resistances

Variations in ink resistivity can also occur over the course of a large print run. These variations in resistivity are due to a number of factors including printing process temperature and viscosity variations. Consequently, these variations are only detectable over a large number of tickets that were printed over a long period of time. The resistivity of the ink on a single ticket does not fluctuate in this manner. However, the resistance of a resistor track printed at the beginning of a print run can be measurably different than the resistance of an identical resistor track printed with the same conductive ink at the end of a print run due to these time-dependent variations in the resistivity of the conductive ink. Consequently, it is desirable that these time dependent variations in the electrical signature be compensated for when the external verification machine 108 tests the authenticity and integrity of the document.

The external verification machine, such as external verification machine 108, compensates for such time-dependent variations in the measured electrical signature in one or both of two ways: (1) by establishing that the measured values are accurate within a specified range of an expected value; or (2) by using a separate circuit element to establish the precision of the measured electrical signature.

In the preferred embodiment, the external verification machine compensates for time dependent variations in the electrical signature by determining that the measured values are accurate within a range of, for example, 10 percent, of the expected electrical signature. Thus, for example, a measured resistance that is expected to be 500Ω would be acceptable as long as the resistance was in the range between 450Ω and 550Ω. In other words, if the measured resistance was within this range, the corresponding play spot is treated by the external verification machine 108 as not having been rubbed off and therefore as being in its original integral state as well as presumably authentic.

Figure 32:
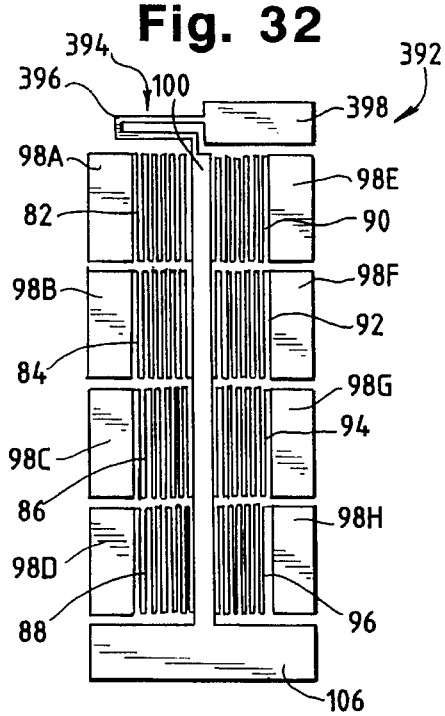
FIG. 32 is a plan drawing of a partial printed circuit which includes a calibration line.

If the time dependent variations in the electrical signature are corrected by using a precision system, the partial circuit printed on the ticket must contain an additional element, a calibration line, which is used to determine if a measured resistance is precise. FIG. 32 is a plan drawing of an alternative embodiment of a T-square circuit 392 which includes a calibration line shown generally at 394. The calibration line 394, termed a John Galt line, includes a resistor track 396 connected to a conductive area 398. The remaining elements of the partial printed circuit 392 are analogous to and function in the same manner as the T-square circuit shown in FIG. 20. Hence, the remaining elements of the circuit 392 in FIG. 32 correspond to the circuit elements shown in FIG. 20. The calibration line 394 is connected to the rest of the circuit 392 via the central conductive area 100. The resistor track 396 is printed on a portion of the ticket which does not include play spot areas. Consequently, the resistor track 396 should remain in its original integral state after the ticket has been played. When a ticket containing the calibration line 394 is coupled to the external verification machine 108 the resistor track 396 is coupled to the excitation and detection circuitry of the external verification machine 108 by the capacitors formed by coupling the conductive areas 100 and 398 to capacitor plates in the external verification machine 108.

In the partial circuit 392 shown in FIG. 32, the calibration line 394 is used to determine how far the measured resistances of a particular ticket should deviate from the expected value for these resistances. For example, if the calibration line 394 is printed with an expected resistance of 500Ω, but measured resistance of the calibration line 394 on a particular ticket actually has a calibration value resistance of 525Ω, the five percent increase over the expected value should be seen in other resistances on the card as well. Therefore, even if a measured resistance of a play spot area is within the acceptable value of 10 percent above or below the expected value, it should be approximately five percent higher than the expected value in order to be precise for this ticket. Thus, if a given resistance corresponding to one of the play spots is eight percent below the expected value and therefore within plus or minus ten percent of the expected resistance, the spot would be deemed to have been played because the resistance, although accurate, is not within the calibrated precision for this ticket.

D. Protection Of The Bar Code

A circuit printed on a lottery ticket, such as the circuit 81 printed on the ticket 50 shown in FIG. 2, can include a partial printed circuit which provides an electrical signature to protect the bar code 80. As noted with reference to FIG. 19, the bar code partial circuit includes a resistor track 107 connected to two conductive areas 150 and 104. In addition, the conductive area 150 immediately underlies the conductive area 106 of the partial printed circuit 164 used to determine the authenticity and integrity of the play spot areas, as shown in FIGS. 2 and G. Hence the partial printed circuit for the bar code 80 and the partial printed circuit 164 for the play spot areas are electrically connected via the overlying relationship of the conductive areas 106 and 150. Consequently, when the external verification machine 108 transmits the excitation signal to the ticket 50 via the central conductive track 100, the excitation signal can be routed to the bar code partial circuit via the conductive areas 106 and 150. The detection signal from the bar code 80 is routed to the remaining excitation and detection circuitry via the capacitor formed by the conductive area 104 and a capacitor plate in the external verification machine 108.

The bar code 80 is in turn printed on the ticket 50 to at least partially overlie the bar code partial circuit. In the preferred embodiment shown in FIGS. 1 and 2, the bar code 80 is printed on the ticket 50 so that it overlies the conductive area 104. Alternatively, the bar code 80 could be printed to overlie the resistor track 107. In either embodiment, attempts to alter the bar code 80, for example by substituting the bar code 80 of the ticket with the bar code of a different ticket, would result in changes in the measured electrical signature of the bar code 80 by changing either the resistance or the capacitance of the bar code partial circuit.

E. Alternative Circuit Designs

In addition to resistors, other types of electrical circuit elements can be used in a printed circuit to produce electrical circuits. For example, the elements used to couple a document, such as the ticket 50, to an external verification machine 108 are not limited to capacitor plates or areas but can also include inductive, radio frequency, and optical frequency circuit elements. In addition, the form of the electrical signature can be varied so that a properties other than resistance can be used to validate or determine the authenticity and integrity of a document. Examples of alternative electrical signatures include gain, amplitude, frequency, oscillation, and thermal effects.

1. Coupling

There are a number of methods by which the a circuit printed on a document, such as the circuit 81 on the ticket 50, can be coupled to the external verification machine 108 including direct, capacitive, inductive, radio frequency and optical coupling methods. In direct coupling, the ticket is coupled to the external verification machine via direct physical contact of one or more conductive areas on the ticket with an electrical element, such as a contact plate, within the external verification machine 108. Although it is relatively straightforward to implement, direct coupling has the potential disadvantage of signal distortions which can arise from surface imperfections or impurities on the conductive areas of the ticket.

In capacitive coupling one or more conductive areas such as the areas 98A–H of the ticket 50 shown in FIG. 2 form one plate of a capacitor. The other plate of the capacitor is provided by a metal plate connected to the circuitry of the external verification machine 108. As described previously, the resulting capacitor can be used to form part of a verification circuit 225 as shown in the block diagram of FIG. 18. Here the conductive areas 98A–C of the ticket 50 form capacitors with the plates 200–204 of the external verification machine 108.

Figure 33:
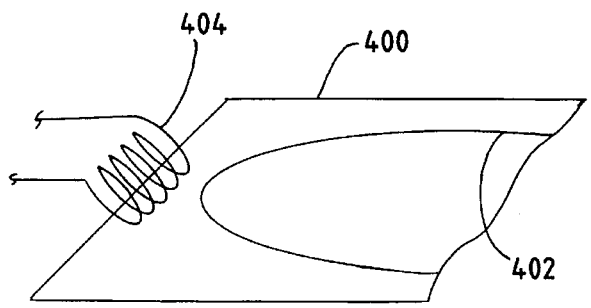
FIG. 33 is a partial plan drawing illustrating a ticket inductively coupled to an external verification machine.

Inductive coupling is similar in that a ticket 400 is printed with a circular conductive area 402 as illustrated in the example of FIG. 33. The external verification machine 108 would then include a coil 404 that is inductively coupled with the circular conductive area 402 when the ticket 400 is inserted in the external verification machine 108. There are a variety of configurations that can be used including a number of inductors printed on the ticket 400 that would be inductively coupled with a corresponding number of coils in the external verification machine 108.

Figure 34:
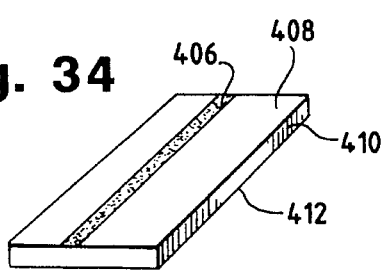
FIG. 34 is a partial plan drawing of a conductor which can be printed on a ticket to provide an RF antenna.

Radio frequency can also be used for verification as shown in FIG. 34. In this case a planar transmission line 406 is printed on a ticket 408 which is separated by the ticket substrate 410 from a ground plane 412 printed on the other side of the substrate 410. With this structure radio frequency energy is transmitted and received in a transverse electromagnetic mode. Using this approach verification signals can be transmitted to the circuits printed on the ticket 408 from suitable antennas located in the external verification machine 108.

In addition, optical frequency can be used for verification where for example a photo emitter conductor or semiconductor is printed on the ticket 50 and is electrically stimulated to emit light at an infrared frequency. Photo-detectors on the external verification machine 108 can be used to detect and classify the frequency of the light emitted by the ticket 50 in contrast to the nominal reflective background of the ticket 50.

2. Signature Verification

There are a number of methods for verifying the authenticity or integrity as well as to determine the redemption value of a lottery ticket, such as the ticket 50, using the external verification machine 108. One method is to merely check for an open circuit in the circuit printed on the ticket 50. Here a signal is applied to the ticket circuit by one of the techniques described above and if no current flow is detected then it can be assumed that a play spot 72A–H has been removed or that the ticket has been tampered with.

Gain can also be used where the external verification machine 108 includes an operational amplifier and the circuit element printed on the ticket 50 serves in its feedback loop. The gain of the operational amplifier will reflect any changes in the ticket circuit and thus can be used to detect tampering or to determine which play spots 72A–H have been scratched off by the player.

Amplitude of the voltage, current or power of the AC signal flowing through circuit printed on the ticket 50 can additionally be measured by the external verification machine 108 to indicated changes in the circuit that would reflect alterations in the ticket 50.

The phase of a signal flowing thought the circuit printed on the ticket 50 can also be checked by the external verification machine 108 against an expected or predetermined value to determine changes in the circuit.

Frequency of the electrical signal induced in the circuit printed on the ticket can be measured by the external verification machine to detect changes in the ticket. This is an especially useful approach where the circuit on the ticket 50 includes elements such as capacitors or inductors which can affect frequency.

A measure of oscillation frequency can also be used where the circuit printed on the ticket combined with the circuit in the external verification machine forms 108 an oscillator or where a complete oscillator circuit is printed on the ticket 50. Here an expected oscillation frequency can be used to detect changes in the ticket 50.

Figure 35:
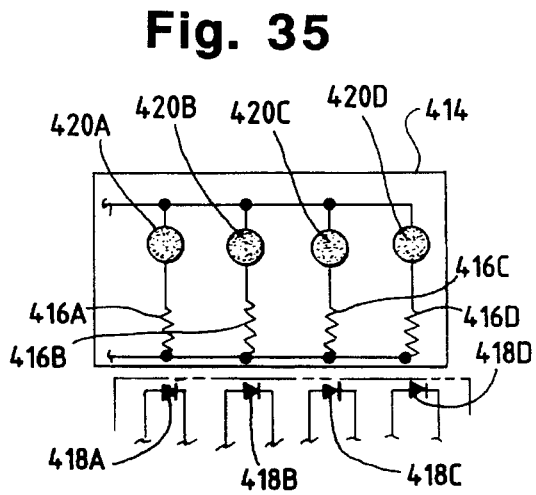
FIG. 35 is a partial schematic circuit diagram of circuit which measures thermal variations to determine the authenticity and integrity of a ticket.

Thermal effects are another phenomena that can be used by the system described above to detect tampering or determine which play spots have been removed from a ticket 414 of the type shown in FIG. 35. In this case heat generated by current flowing though a set of resistors 416A–D is detected by a group of infrared photodetectors 418A–D located in the external verification machine 108. When one or more of a set of play spots 420A–D is removed current will no longer flow though its associated resistor and the resulting lack of infrared radiation would indicate that the spot(s) had been removed.

Capacitance and inductance changes in the circuits printed on the ticket 50 can likewise be detected by the external verification machine 108 indirectly from the frequency characteristics of the circuits in order to determine whether changes have occurred on the ticket 50.

V. Validation of Lottery Tickets

Validation of the lottery ticket 50 as well as the determination the authenticity and integrity of a document, such as ticket 50, can involve the interaction of several steps. As an example, a description of a preferred method for validating the lottery ticket 50 of FIG. 1 using the external validation machine 108 of FIG. 14 is provided below. When an individual presents the ticket 50 to a lottery agent for redemption, the lottery agent insert the ticket 50 into the external verification machine 108. The external verification machine will read the bar code 80, which contains the inventory control number and encrypted validation number data, and it will sense which of the play spots 72A–G have been removed. The lottery agent then enters the validation number 78 of the ticket 50 into the external verification machine 108 via the user interface 178. As noted earlier, the validation number 78 contains information related to the identity of a specific ticket, such as the pack and ticket number. In addition, in the preferred embodiment the validation number 78 also contains information related to the electrical signatures of the circuit elements printed on the ticket 50. For example, the ticket 50 has two electrical signatures. One signature is the expected resistance of the bar code resistor track 107. The second is the expected resistance of the play spot resistor tracks 82–96 which all have the same value. If the play spot resistor tracks had different expected values, such as the resistor tracks 294–308 in the partial circuit 292 shown in FIG. 21, information related to each electrical signature could be stored in the validation number 78 of the ticket 50. Alternatively, the information related to the electrical signature(s) of the circuit elements printed on the ticket 50 could be stored in a look-up table in the microprocessor on the processor board 220 in the external verification machine 108 or the central computer 223. In this case, the validation number 78 or the encryped validation number printed in the bar code 80 is used primarily to correlate the particular ticket being tested with the electrical signature information stored in the computer. Alternatively, data related to the expected signal can be contained in the validation number 78. In either case, the validation number provides the primary method for accessing the information related to the expected electrical signature(s) of the ticket.

After the ticket 50 is coupled to the external verification machine 108 via the ticket interface 176, the external verification machine 108 completes the discreet verification process for each of the play spot resistor tracks 82–96, as explained above in Section IV.A. The external verification machine determines the measured electrical signature for each of the play spot resistor tracks 82–96 and compares these values to the value or values stored either in the validation number 78 of the ticket 50 or in a look-up table in the central computer 223 or the processor board 220. If the measured resistance of a specific play spot resistor track 82–96 is substantially the same as the stored value of the resistance, the associated play spot area 72A–G is in its original integral state and has not been at least partially removed. If, on the other hand, the measured resistance is substantially different than the stored value for the resistance, the associated play spot area 72A–G is treated by the external verification machine 108 as having been removed. This occurs, for example, when the associated play spot area has been at least partially removed by a player playing the ticket or when the ticket has been tamped with.

In this particular example, the ticket 50 is considered valid only if the number of play spot areas 72A–G specified in the rules 58 have been removed to reveal the underlying play indicia 74. For example, the rules 58 for a particular game may require rubbing off only three play spot areas 72A–G. If an individual rubs off more than three play spot areas 72A–G, the ticket 50 is void even if three of the revealed play indicia 74 match. If the external verification machine 108 determines that the ticket 50 is valid, that is the ticket 50 has been played according to the rules 58, the external verification machine 108 then proceeds to determine the redemption value of the ticket 50.

The external verification machine 108 can validate or determine the redemption value of the ticket, such as ticket 50, in either of two ways: (1) by accessing the play indicia value data stored in the bar code 80 on the ticket 50; or (2) by accessing a ticket redemption file contained in the central computer 223 or the processor 220. Storing the play indicia value data in the bar code 80 has the advantage of permitting local determination of the redemption value of the ticket 50. Consequently, any lottery terminal can determine the redemption value of a ticket without contacting a central lottery or host computer thus reducing the cost and time required in the redemption process. On the other hand, it is not inconceivable that the play spot value code in the bar code 80 could be broken even though there are a very large number of potential play spot value combinations that can be primed on the ticket 50. As a result there is some possibility that an individual could predict the winning combinations present on ticket 50 based upon the bar code 80. Maintaining a separate ticket redemption value file in the central computer 223 or the processor 220 will normally result in increased ticket security because the play indicia value data are not stored in a bar code 80 on the ticket 50. Such a system, however, requires communication with the central computer 223 or the processor 220 in the external verification machine 108 before the ticket 50 can be redeemed. As a result, this type of redemption process, especially where a remote central computer 223 is used, can be slower and more costly than storing the play indicia value data in the bar code.

In the preferred embodiment of the invention, therefore, the method of storing play indicia or redemption value data in the bar code 80 typically would be used only for low level prizes. The larger cash prizes would be computed by the lottery central computer 223 in order to increase the security of the system with respect to high tier prizes or redemption values. In this embodiment, the bar code 80 would store information concerning all the play indicia 74 on the ticket 50. The bar code 80 can consist of, for example, 22 digits which represent a game number (2 digits), a pack number (6 digits), a check digit (1 digit), a ticket number (3 digits) and a play spot code (10 digits). The game number is unique to each particular lottery game. The pack number identifies the pack from which a particular ticket originates. The check digit is used to help ensure that a proper bar code read has been made. The ticket number relates the relative position of a specific ticket within a pack. In this example, the game number, the pack number and the ticket number represent ticket identification or accounting data and normally in themselves do not contain redemption value information.

Figure 36:
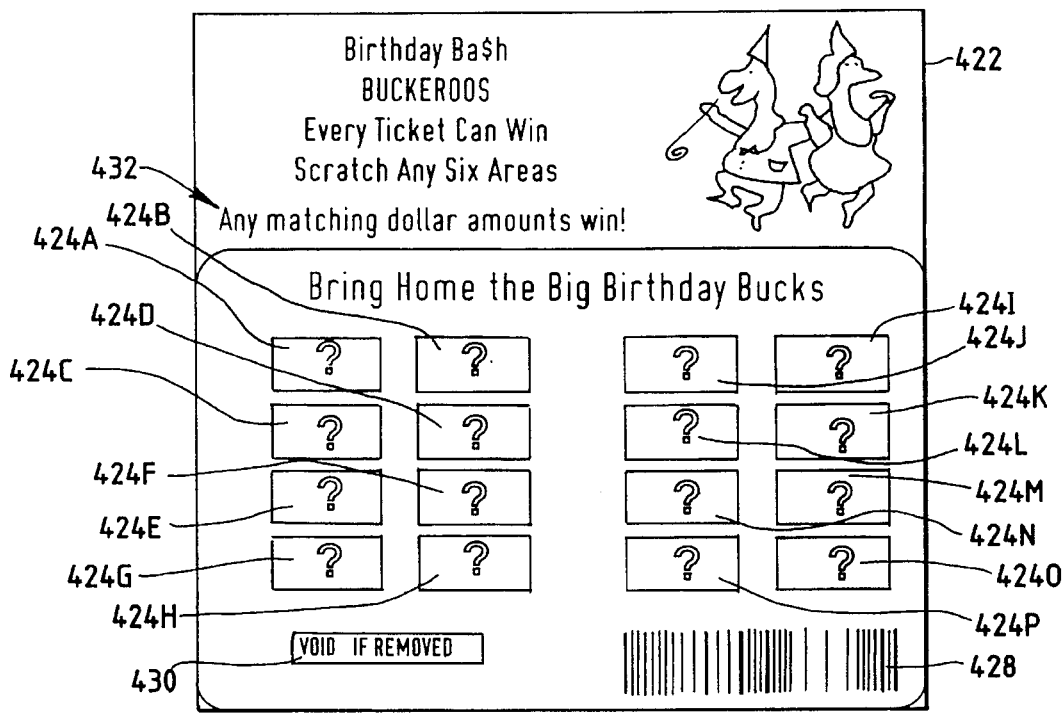
FIG. 36 is a plan drawing of a lottery ticket having sixteen play spot areas.
Figure 37:
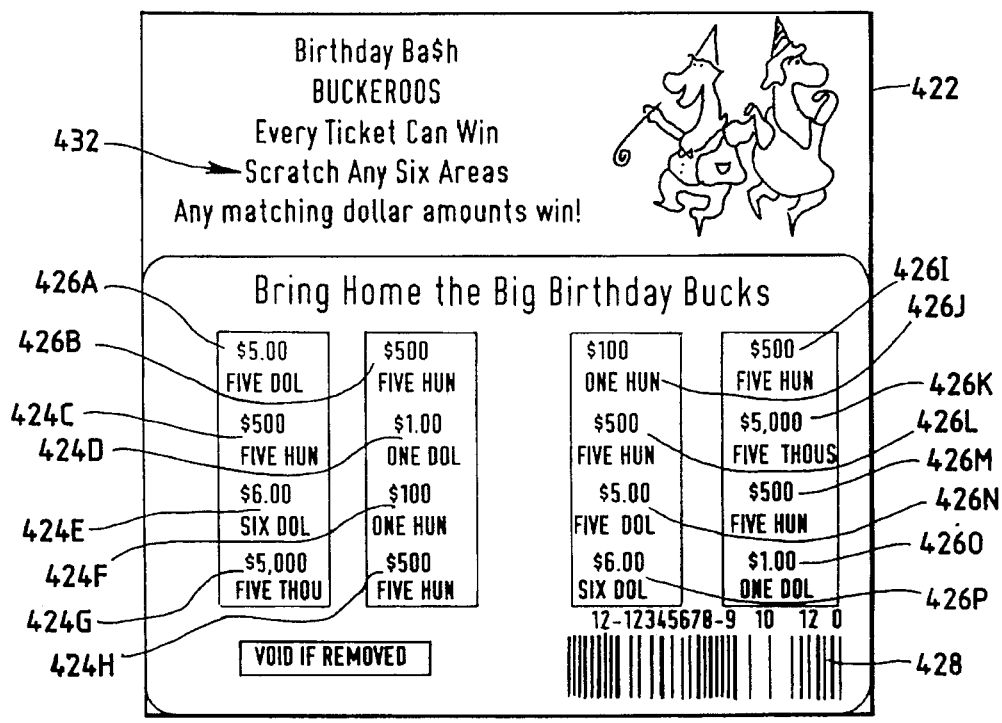
FIG. 37 is a plan drawing of the ticket in FIG. 36 having the play spot areas removed to reveal the underlying play indicia.

The 10-digit play spot code includes a value portion containing information about the value of each of the play indicia of each of the play spots areas. An illustration of how such a 10-digit play spot code can be used in a probability lottery ticket 422 is provided in FIGS. 36 and 37. Referring to FIG. 36, the ticket 422 has sixteen play spots areas 424A–P each of which covers a play indicia 426A–P which are shown in FIG. 37. The ticket 422 also includes a bar code 428 and a void-if-removed area 430 which conceals a validation number (not shown) as well as a set of printed information 432 concerning the rules for playing the ticket 432. In the example illustrated in FIGS. 36 and 37, the rules 432 state that only six play spot areas 424A–P may be removed. The ticket 422 can be redeemed for a prize if any two of the revealed play indicia 426A–P match. FIG. 37 illustrates the ticket 422 after all of the play spot areas 424A–P have been removed to reveal the underlying play indicia 426A–P.

For a ticket with 16 play spots areas, such as the ticket 422, two bits of the value portion in the play spot code are used to store information concerning the value of the play indicia 426A–P for each play spot area 424A–P. In this example, the values of these bit pairs are as follows: "00" signifies that the value of the play spot area cannot be checked locally by the external verification machine 108; "01" signifies that the value of the play indicia equals $1.00; "10" indicates that the value of the play indicia equals $2.00; and "11" indicates that the value of the play indicia equals $5.00. In other words, all play indicia that contain the $1 symbol are represented by the bit pattern "01", play indicia that contain a $2 symbol are represented by the bit pattern "10", and play indicia that contain the $5 symbol are represented by the "11" bit pattern. Any play indicia having a value other than $1, $2 or $5 has a corresponding bit pattern of "00". Thus, for example, all play spots having $10, $20, $50 or $100 symbols would have corresponding bit patterns of "00". The bit pattern "00" indicates that the play indicia value for the corresponding play spot area 424A–P cannot be determined locally and must be determined by accessing the redemption file in the central computer 223. The bit patterns for all of the play indicia 426A–P are strung together to form a 32-bit binary number. For example, the 32-bit binary number corresponding to the play indicia 426A–P would be as follows:

11 00 00 00 00 11 00 00 00 00 11 00 00 00 00 01

This binary number then is converted to base 10 in which the 32-bit number is represented by 10 digits, in this case 3,224,374,273. These 10 digits are encrypted to form the play spot code which forms a part of the bar code 428. It should be noted that the 32-bit binary number can also be converted to numbers having other bases such as hexadecimal. For example, the hexadecimal value of the above 32-bit binary number would be C0300C01.

The bar code reader 210 in the external verification machine 108 reads the bar code 428 including the play spot code. The computer on the processor board 220 in the external verification machine 108 decrypts the 10 digit, base 10 play spot code and then converts it to a binary number thereby creating a 32-bit number with a 2-bit code corresponding to each of the 16 play indicia 426A–P. The computer in the external verification machine 108 then compares the two-bit pattern stored in the play spot code for each play spot area 424A–P which has been previously determined by the detection circuitry of the external verification machine 108 as having been played. If two or more of the rubbed-off play spot areas have a value of "00" (i.e., "can't check locally"), the external verification machine 108 can not determine locally whether the ticket 422 is a winner of a high tier prize and if so, the redemption value of the ticket 422. Thus, in the exemplary ticket 422 illustrated in FIGS. 36 and 37, if the bit pattern for any of the revealed play indicia 426A–P matches the bit pattern for a second revealed play indicia 426A–P, the redemption value of the ticket 422 equals the value of the matching play indicia 426A–P. For example, if two of the revealed play indicia 426A–P have a bit pattern equal to "11", the redemption value of the ticket 422 is five dollars. The external verification machine 108 then informs the lottery agent of the redemption value of the ticket 422 via the display 180 or the printer 181 so that the ticket 50 can be paid.

If two the entries in the table corresponding to the rubbed-off spots are "00", however, the external verification machine 108 will not be able to locally determine the redemption value of the ticket 422. Here the "00" bit pattern indicates that the rubbed-off play spots represent a high redemption value or that there may be more than one possible redemption value, for example, the value of all play indicia greater than five dollars. In this case, the external verification machine 108 accesses the ticket redemption file in the central computer 223 to determine the redemption value of the ticket 422. In one arrangement the redemption file in the central computer 223 contains a record or a list for each ticket 422 in which the play indica value data are stored in association with a ticket identity number. The ticket identity number, for example accounting data contained in the bar code 428 or contained in a conventional validation number 78, which uniquely identifies a ticket within a game is transmitted to the central computer 223 and can be used as an address to locate the record in the redemption file containing the indica or redemption values for that ticket. Thus, for example, the ticket redemption file for the ticket 422 includes play indicia value data which enables the central host computer 223 to determine whether or not any two of the rubbed-off spots has the same symbol (e.g., all $10, all $20, etc.). The central host computer 223 then transmits a signal to the external verification machine 108 indicating whether or not the ticket 422 is a winner, and if so, the redemption value of the ticket 422. It should be noted that the functions of the central computer 223 and its associated redemption file as described above can be preformed by the computer in the processor board 220 of the external verification machine 108.

As an alternative more than 2 bits can be used to represent each play spot. This will permit more or even all of the play spot areas to be validated by the external verification machine 108. This embodiment reduces or eliminates calls to the central host computer 223. However, this embodiment requires a longer play spot code and, hence, a longer bar code 428 if all the other fields in the bar code are kept at the same size as in the previous embodiment. As indicated above, the size of the bar code 80 can be reduced if a play spot code having a base larger than 10 is used.

A second approach to ticket validation involves using a validation file in the central computer 223 rather than encoding play indicia value data in the bar code 428 on the lottery ticket 422. In this embodiment, the validation number only contains information related to the identity of the ticket, for example, the game number, pack number and ticket number. The validation number is read by the external verification machine 108 when, for example, the lottery agent inputs the validation number via the keyboard 178 of the external verification machine 108. Alternatively, the validation number and game number can be stored on the ticket in a machine-readable format, for example, as part of the bar code 428 or even as a magnetic stripe. After the external verification machine 108 determines which play spot areas have been removed, the external verification machine 108 transmits the data as to which play spot areas have been removed along with the validation number to the central computer 223. The central computer 223 contains the redemption or validation file which includes information corresponding to the ticket identification information for each ticket as well as a record with play indicia value data corresponding to each of the play spot areas 424A–P on each ticket 422. The central computer 223 then uses the ticket identification information to read the record corresponding to the ticket 422 and obtains the play indicia value data corresponding to the play spot areas 424A–P that have been removed. If the number of the rubbed-off play spot areas 424-P specified in the rules 432, contain the same symbol, the ticket is a winner. The central computer 223 then determines the redemption value corresponding to the matching play indicia value data and sends authorization to the external verification machine 108 so that the redemption value can be paid. An additional advantage of this approach is that after a ticket has been presented for redemption, the records within the validation file which correspond to the ticket can be updated to reflect that the ticket has been verified by the external verification machine 108 and the central computer 223. Consequently, the ticket 422 can be presented for redemption only one time and thereafter the validation file contains information indicating that the ticket has been previously paid.

VI. Stigmatization

There are cases where it is desirable to provide a positive indication that a document such as the lottery ticket 50 has been verified or validated by the external verification machine 108. This process is termed stigmatization. One approach as described above in Section V. is to register each ticket 50 or document in a central computer that is connected to the external verification machine. Another approach is to stigmatize the ticket 50 or document itself.

Providing a hole puncher in the external verification machine 108 is one way to accomplish this object. In this case a hole is punched though a critical portion of the partial printed circuit after the verification process has taken place.

Printing a cancellation or void indication on the document by means of a printer such as a dot matrix printer (not shown) located in the external verifications machine 108 after verification is another approach that can be used.

Fuses located in the circuits printed on the document can be used to stigmatize or void the document. Here sufficient power is applied to the document such as the lottery ticket 50 by the external verification machine 108 to break for example one or more of the resistors 82–94 or blow selected fuses printed on the document. It should be noted that fuses of this nature can also be used to store specified information in the document. For example, if an array of fuses is printed on the document, information can be stored on the document by having the external verification machine 108 selectively burn certain fuses much as a PROM is programmed. This technique has applications other than lottery tickets such as an alternative to magnetic stripes on credit cards. Information burned in by blowing fuses can be far more difficult to alter than information contained in a magnetic stripe.

Coloration can also be used to stigmatize the document. In this case the document such as the lottery ticket 50 would also be printed with temperature sensitive ink. Power applied to the document by the external verification machine 108 would generate sufficient heat in the circuits printed on the document to change the color of at least a portion of the document.

VII. Other Applications Of The Invention

The present invention is not limited to validating or determining the authenticity and integrity of probability game lottery tickets, but is applicable in many circumstances in which fabricated circuit boards, bar code readers and magnetic stripes are used. For example a document such as a stock certificate could be printed with electronic circuits similar to the resistors 82–96 printed on the lottery ticket 50 where the electrical signatures of the circuits represent verification data such as a serial number. Human readable document data such as the serial number would also be printed on the stock certificate. The electronic verification machine 108 would then electrically couple with the circuit elements as described above to generate a verification signal representing the electrical signatures and hence the verification data. Authentication of the certificate is then accomplished by the processor board 220 which relates or compares the verification signal to a data signal representing the document data. The data signal can be generated by an optical character reader or a user interface such as the keyboard 178. In this manner the electronic document machine can verify that the serial number printed on the certificate is the correct one for the certificate and thus authenticate the document.

It will then be appreciated that the present invention will have utility in a variety of areas including coupon redemption, inventory security, airport tracking systems, magnetic stripes, currency security, compact disk security, drivers license and passport security, solar cells, and circuit boards. Coupon fraud is a serious problem for the retail industry. Current estimates of money lost to coupon fraud range in the hundreds of millions of dollars. Moreover, with the advent and growth of desk-top publishing and color-photocopiers, the opportunities for coupon fraud as well as other types of document fraud will increase. The present invention can be used to stem the growth of coupon fraud. Providing coupons with an electrical signature by printing at least a portion of an electric circuit on the coupons, according to the invention, would provide the ability to verify the authenticity of the coupons submitted for payment. Further, by utilizing the stigmatizing technique described above it will be possible to prevent coupons from being redeemed more than once. As to inventory security, the circuits according to the present invention can be printed directly on an inventory ticket, price tag or manufacturer's tag thus supplanting the use of metal strips and coils. Airline ticket fraud, which may also cost hundreds of millions of dollars annually, present another application for the present invention. Circuits according to the present invention could be used to ensure the authenticity and integrity of airline tickets. In addition, the present invention could be used to track the luggage associated with airline travel. The present invention can also be used as an effective alternative to magnetic stripes. Magnetic stripes contain identification numbers, for example, credit card numbers, that are programmed at manufacture. The stripes are prone to failure and are subject to fraud because they are easily copied or modified. To overcome these shortcomings, circuits according to the present invention could be printed on a substrate and encoded with specific customer information. Thus the present invention can be used to improve the security of credit cards, automatic teller machine ("ATM") cards, and any other tracking card which uses magnetic stripes as a security measure. The present invention can also be used to mitigate the losses resulting from currency fraud which includes, for example, counterfeit currency, and check forgery. Counterfeiting of these documents could be reduced if the documents were provided with an electrical signature according to the invention. The invention could be used in the same manner to improve the security of drivers licenses and passports. The invention could also be used to provide inventory control of compact disks which, because of their small size, are subject to theft. Circuits according to the present invention, which included RF devices, could be used to track the compact disks and to prevent their clandestine removal. The present invention also has applications beyond the general area of secure documents, for example, in the manufacture of solar cells and circuit boards.

We claim:

1. A lottery ticket comprising:

a substrate;

play indicia printed over said substrate;

an upper circuit element at least a portion of which is printed over at least one of said play indicia; and a scratch-off material covering at least a portion of said circuit element.

2. The ticket of claim 1 additionally including a primer material interposed between said play indicia and said substrate.

3. The ticket of claim 1 additionally including a seal coat interposed between at least a portion of said circuit element and said play indicia.

4. The ticket of claim 3 additionally including a plurality of lower circuit elements printed over said substrate under said seal coat.

5. The ticket of claim 4 wherein a portion of said lower circuit elements includes a light blocking cell and wherein said light blocking cell is located beneath said play indicia.

6. The ticket of claim 5, wherein a first of said lower circuit elements includes a connection element located such that said connection element is in direct electrical contact with said upper circuit element.

7. The ticket of claim 5 additionally including a bar code printed on the ticket and wherein one of said lower circuit elements is interposed between said substrate and said bar code.

8. The ticket of claim 4 additionally including a bar code printed on the ticket and wherein one of said lower circuit elements is interposed between said substrate and said bar code.

9. The ticket of claim 4 additionally including an opaque blocking material interposed between said play indicia and said lower circuit elements.

10. The ticket of claim 1 additionally including a release coat material interposed between said circuit element and said play indicia.

11. The ticket of claim 1 additionally including a seal-release coat material interposed between said circuit element and said play indicia.

12. The ticket of claim 11 wherein said seal-release coat is an ultra violet curable material.

13. The ticket of claim 1 additionally including an overprint graphic printed over said scratch-off material.

14. The ticket of claim 13 additionally including a release coat material interposed between said circuit element and said scratch-off material.

15. The ticket of claim 1 wherein said upper circuit element printed underneath said scratch-off material includes a resistor track and wherein said upper circuit element additionally includes a capacitive pick-up area not located over said play indicia and which is connected to said resistor track.

16. The ticket of claim 1 additionally including an opaque blocking material interposed between said substrate and said scratch-off material.

17. The ticket of claim 16 wherein said opaque blocking material is interposed between said substrate and said play indicia.

18. The ticket of claim 17 additionally including a primer material interposed between said opaque blocking material and said play indicia.

19. The ticket of claim 1 additionally including a lower circuit element interposed between said play indicia and said substrate.

20. The ticket of claim 19 wherein said lower circuit element is in electrical contact with said upper circuit element.

21. The ticket of claim 1 wherein said substrate is paper.

22. The ticket of claim 1 wherein said substrate includes a metal foil.

23. The ticket of claim 22 wherein said metal foil is in electrical contact with said circuit element.

24. A lottery ticket comprising:

a substrate;

printed play indicia; and a printed circuit element.

25. The ticket of claim 24 additionally including a scratch-off coating covering said play indicia.

26. The ticket of claim 25 wherein said printed circuit element is interposed between said play indicia and said substrate.

27. The ticket of claim 26 wherein a substantially opaque potion of said circuit element is interposed directly between said play indicia and said substrate.

28. The ticket of claim 24 additionally including a primed electrically conductive calibration line.

* * * * *